United States Patent
Broyde et al.

(10) Patent No.: US 9,680,510 B2
(45) Date of Patent: Jun. 13, 2017

(54) RADIO COMMUNICATION USING TUNABLE ANTENNAS AND AN ANTENNA TUNING APPARATUS

(71) Applicant: Samsung Electronics Co., Ltd., Suwon-si, Gyeonggi-do (KR)

(72) Inventors: Frédéric Broyde, Maule (FR); Evelyne Clavelier, Maule (FR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/918,055

(22) Filed: Oct. 20, 2015

(65) Prior Publication Data
US 2016/0043751 A1  Feb. 11, 2016

Related U.S. Application Data

(63) Continuation of application No. PCT/IB2015/051644, filed on Mar. 6, 2015.

(30) Foreign Application Priority Data

Mar. 20, 2014 (FR) .................................... 14 00666

(51) Int. Cl.
*H04B 1/00* (2006.01)
*H01Q 1/52* (2006.01)
(Continued)

(52) U.S. Cl.
CPC ............. *H04B 1/0064* (2013.01); *H01Q 1/52* (2013.01); *H01Q 9/145* (2013.01);
(Continued)

(58) Field of Classification Search
CPC ........ H04B 1/0064; H01Q 1/52; H01Q 9/145; H01Q 1/0006
(Continued)

(56) References Cited

U.S. PATENT DOCUMENTS

| 2,745,067 A | 5/1956 | True et al. |
| 4,493,112 A | 1/1985 | Bruene |

(Continued)

FOREIGN PATENT DOCUMENTS

| FR | 2996067 A1 | 3/2014 |
| FR | 2996082 A1 | 3/2014 |

(Continued)

OTHER PUBLICATIONS

Chan Wai Po et al, "A Novel Method for Synthesizing an Automatic Matching Network and Its Control Unit", IEEE Transactions on Circuits and Systems—I: Regular Papers, vol. 58, No. 9, pp. 2225-2236, Sep. 2011.

(Continued)

*Primary Examiner* — Hai V Nguyen
(74) *Attorney, Agent, or Firm* — Jefferson IP Law, LLP

(57) ABSTRACT

The invention relates to a method for radio communication using one or more tunable antennas and an antenna tuning apparatus, and to an apparatus for radio communication using one or more tunable antennas and an antenna tuning apparatus. An apparatus for radio communication of the invention comprises: 4 antennas, each of the antennas being a tunable passive antenna; a radio device; an antenna tuning apparatus having 4 antenna ports, each of the antenna ports being coupled to one of the antennas through a feeder, the antenna tuning apparatus having 4 radio ports, each of the radio ports being coupled to the radio device through an interconnection; and a tuning control unit, the tuning control unit receiving a tuning instruction generated automatically within the apparatus for radio communication, the tuning control unit delivering a plurality of tuning control signals to the antenna tuning apparatus and to the tunable passive antennas.

40 Claims, 7 Drawing Sheets

(51) Int. Cl.
*H01Q 9/14* (2006.01)
*H03H 7/38* (2006.01)
*H01Q 21/00* (2006.01)
*H03J 1/00* (2006.01)
*H03J 7/04* (2006.01)
*H01Q 9/04* (2006.01)
*H01Q 9/20* (2006.01)

(52) U.S. Cl.
CPC .......... *H01Q 21/0006* (2013.01); *H03H 7/38* (2013.01); *H03J 1/0008* (2013.01); *H03J 7/04* (2013.01); *H01Q 9/0421* (2013.01); *H01Q 9/20* (2013.01)

(58) Field of Classification Search
USPC .......................................................... 455/77
See application file for complete search history.

(56) References Cited

U.S. PATENT DOCUMENTS

| | | | | |
|---|---|---|---|---|
| 7,499,681 | B2* | 3/2009 | Chang | H04B 1/0458 343/853 |
| 7,898,493 | B1* | 3/2011 | Rojas | H01Q 5/00 343/850 |
| 7,983,645 | B2* | 7/2011 | Broyde | H04B 7/08 455/273 |
| 8,059,058 | B2* | 11/2011 | Lau | H01Q 1/521 343/853 |
| 8,102,830 | B2 | 1/2012 | Yokoi et al. | |
| 8,204,446 | B2* | 6/2012 | Scheer | H01Q 1/242 455/129 |
| 8,406,806 | B2* | 3/2013 | Wong | H01Q 1/243 455/550.1 |
| 9,077,317 | B2* | 7/2015 | Broyde | H04B 1/0458 |
| 9,083,074 | B2* | 7/2015 | Ayatollahi | H01Q 1/243 |
| 9,130,279 | B1* | 9/2015 | Lee | H01Q 21/28 |
| 9,154,608 | B2* | 10/2015 | Toksvig | H01Q 1/243 |
| 9,203,138 | B2* | 12/2015 | Bavisi | H01Q 1/243 |
| 9,236,659 | B2* | 1/2016 | Vazquez | H01Q 13/103 |
| 9,293,806 | B2* | 3/2016 | Kwong | H01Q 1/44 |
| 9,294,174 | B2* | 3/2016 | Broyde | H01Q 3/40 |
| 9,337,534 | B2* | 5/2016 | Broyde | H04B 7/0874 |
| 2003/0030594 | A1* | 2/2003 | Larry | H01Q 11/08 343/895 |
| 2004/0041734 | A1 | 3/2004 | Shiotsu et al. | |
| 2009/0209212 | A1 | 8/2009 | Cetiner et al. | |
| 2010/0248673 | A1* | 9/2010 | Broyde | H04B 7/08 455/278.1 |
| 2012/0071203 | A1* | 3/2012 | Wong | H01Q 1/243 455/550.1 |
| 2012/0329524 | A1* | 12/2012 | Kent | G06F 3/044 455/566 |
| 2013/0119924 | A1* | 5/2013 | Kasturi | H04B 5/0087 320/108 |
| 2013/0156080 | A1* | 6/2013 | Cheng | H01Q 1/243 375/222 |
| 2013/0267181 | A1* | 10/2013 | Ayatollahi | H01Q 1/243 455/73 |
| 2014/0179239 | A1* | 6/2014 | Nickel | H04W 24/00 455/67.14 |
| 2014/0266941 | A1* | 9/2014 | Vazquez | H01Q 13/103 343/746 |
| 2014/0306784 | A1* | 10/2014 | Broyde | H04B 1/18 334/78 |
| 2014/0323075 | A1* | 10/2014 | Broyde | H04B 7/0874 455/275 |
| 2014/0364077 | A1* | 12/2014 | Maxim | H03H 7/0115 455/296 |
| 2015/0035522 | A1* | 2/2015 | Ebnabbasi | G01R 33/1223 324/239 |
| 2015/0063486 | A1* | 3/2015 | Broyde | H01Q 3/40 375/267 |
| 2015/0078485 | A1* | 3/2015 | Broyde | H04B 1/0458 375/297 |
| 2015/0255853 | A1* | 9/2015 | Kwong | H01Q 1/44 343/702 |
| 2016/0036474 | A1* | 2/2016 | Broyde | H01Q 1/242 455/77 |
| 2016/0043751 | A1* | 2/2016 | Broyde | H01Q 1/52 455/77 |
| 2016/0049924 | A1* | 2/2016 | Broyde | H01Q 21/0006 343/745 |
| 2016/0164165 | A1* | 6/2016 | Kwong | H01Q 1/44 343/702 |

FOREIGN PATENT DOCUMENTS

| | | |
|---|---|---|
| FR | 3004604 A1 | 10/2014 |
| FR | 3018637 A1 | 9/2015 |
| WO | WO 2008/030165 A1 | 3/2008 |
| WO | WO 2014/049475 A2 | 4/2014 |
| WO | WO 2014/049486 A1 | 4/2014 |
| WO | WO 2014/170766 A1 | 10/2014 |
| WO | WO 2015/136409 A1 | 9/2015 |

OTHER PUBLICATIONS

Gu et al, "An Analytical Algorithm for Pi-Network Impedance Tuners", IEEE Transactions on Circuits and Systems—I: Regular Papers, vol. 58, No. 12, pp. 2894-2905, Dec. 2011.

Boyle et al, "A Self-Contained Adaptive Antenna Tuner for Mobile Phones", Proceedings of the 6th European Conference on Antenna and Propagation (EUCAP), pp. 1804-1808, Mar. 2012.

Broyde et al, "Some Properties of Multiple-Antenna-Port and Multiple-User-Port Antenna Tuners", IEEE Trans. on Circuits and Systems—I: Regular Papers, vol. 62, No. 2, pp. 423-432, Feb. 2015.

Broyde et al, "A New Multiple-Antenna-Port and Multiple-User-Port Antenna Tuner", proceedings of the 2015 IEEE Radio & Wireless Week, RWW 2015, Jan. 2015.

Petosa, "An Overview of Tuning Techniques for Frequency-Agile Antennas", IEEE Antennas and Propagation Magazine, vol. 54, No. 5, pp. 271-296, Oct. 2012.

Search report and written opinion for International Application No. PCT/IB2015/051644.

Taluja et al, "Fundamental Capacity Limits on Compact MIMO-OFDM Systems", Proc. 2012 IEEE International Conference on Communications (ICC), pp. 2547-2552, Jun. 2012.

Yu et al, "Matching Network Optimization for Indoor MIMO", Proc. 2010 IEEE International Conference on Computational Problem-Solving (ICCP), pp. 175-178, Dec. 2010.

* cited by examiner

RADIO COMMUNICATION USING TUNABLE ANTENNAS AND AN ANTENNA TUNING APPARATUS

CROSS REFERENCE TO RELATED APPLICATIONS

This is a Continuation application of PCT application No. PCT/IB2015/051644, filed 6 Mar. 2015, published in English under No. WO 2015/140660, which in turn claims priority to French patent application No. 14/00666 of 20 Mar. 2014, entitled "Communication radio utilisant des antennes accordables et un appareil d'accord d'antenne", both of which are incorporated herein by reference.

FIELD OF THE INVENTION

The invention relates to a method for radio communication using one or more tunable antennas and an antenna tuning apparatus. The invention also relates to an apparatus for radio communication using one or more tunable antennas and an antenna tuning apparatus. The received or emitted radio signals may carry information of any nature, for instance signals for speech transmission and/or image transmission (television) and/or data transmission. The received or emitted radio signals may be used for any type of operation, for instance broadcasting, bidirectional point-to-point radio communication or radio communication in a cellular network.

PRIOR ART

The impedance presented by an antenna depends on the frequency and on the electromagnetic characteristics of the volume surrounding the antenna. In particular, if the antenna is built in a portable transceiver, for instance a mobile phone, the body of the user has an effect on the impedance presented by the antenna, and this impedance depends on the position of the body of the user. This is referred to as "user interaction", or "hand effect" or "finger effect".

An antenna tuning apparatus, also referred to as antenna tuner, is a passive apparatus intended to be inserted between a radio device, for instance a radio transmitter or a radio receiver, and its antenna to obtain that the impedance seen by the radio device matches a target value. FIG. 1 shows a block diagram of a typical use of such an antenna tuning apparatus (31) for tuning a single antenna (11), the antenna operating (or being used) in a given frequency band. The antenna tuning apparatus (31) comprises:

- an antenna port (311), the antenna port being coupled to the antenna (11) through a feeder (21), the antenna port (311) seeing, at a frequency in said given frequency band, an impedance referred to as the impedance seen by the antenna port;
- a radio port (312), the radio port being coupled to the radio device (5) through an interconnection (41), the radio port (312) presenting, at said frequency in said given frequency band, an impedance referred to as the impedance presented by the radio port;
- one or more adjustable impedance devices, each of the adjustable impedance devices having a reactance at said frequency in said given frequency band, the reactance of any one of the adjustable impedance devices being adjustable and having an influence on the impedance presented by the radio port.

The radio device (5) is an active equipment for radio communication such as a transmitter, a receiver or a transceiver. The feeder (21) may for instance be a coaxial cable. In some cases, when the antenna tuning apparatus (31) is placed close to the antenna (11), the feeder (21) is not present. The interconnection (41) may for instance be a coaxial cable. In some cases, when the antenna tuning apparatus (31) is placed close to the radio device (5), the interconnection (41) is not present.

An antenna tuning apparatus behaves, at any frequency in the given frequency band, with respect to the antenna port and the radio port, substantially as a passive linear 2-port device. Here, "passive" is used in the meaning of circuit theory, so that the antenna tuning apparatus does not provide amplification. In practice, losses are undesirable for signals applied to the antenna port or the radio port of an antenna tuning apparatus, in the given frequency band. Thus, an ideal antenna tuning apparatus is lossless for signals applied to its antenna port or radio port, in the given frequency band.

FIG. 2 shows a schematic diagram of an antenna tuning apparatus (31) which could be used as shown in FIG. 1 to tune a single antenna, the antenna being used in a given frequency band. The antenna tuning apparatus shown in FIG. 2 comprises:

- an antenna port (311) having two terminals (3111) (3112), the antenna port being single-ended;
- a radio port (312) having two terminals (3121) (3122), the radio port being single-ended; an adjustable impedance device (313) presenting a negative reactance and being coupled in parallel with the antenna port;
- a coil (315);
- an adjustable impedance device (314) presenting a negative reactance and being coupled in parallel with the radio port.

An antenna tuning apparatus of the type shown in FIG. 2 is for instance used in the article of F. Chan Wai Po, E. de Foucault, D. Morche, P. Vincent and E. Kerhervé entitled "A Novel Method for Synthesizing an Automatic Matching Network and Its Control Unit", published in *IEEE Transactions on Circuits and Systems—I: Regular Papers*, vol. 58, No. 9, pp. 2225-2236 in September 2011. The article of Q. Gu, J. R. De Luis, A. S. Morris, and J. Hilbert entitled "An Analytical Algorithm for Pi-Network Impedance Tuners", published in *IEEE Transactions on Circuits and Systems—I: Regular Papers*, vol. 58, No. 12, pp. 2894-2905 in December 2011, and the article of K. R. Boyle, E. Spits, M. A. de Jongh, S. Sato, T. Bakker and A. van Bezooijen entitled "A Self-Contained Adaptive Antenna Tuner for Mobile Phones", published in *Proceedings of the 6th European Conference on Antenna and Propagation (EUCAP)*, pp. 1804-1808 in March 2012, consider an antenna tuning apparatus of a type similar to the one shown in FIG. 2, the main difference being that the coil (315) of FIG. 2 is replaced with an adjustable impedance device, the adjustable impedance device being a variable inductor or an inductor connected in parallel with a variable capacitor.

An antenna tuning apparatus may be used to compensate a variation in the impedance seen by the antenna port, caused by a variation in the frequency of operation, and/or to compensate the user interaction.

The impedance matrix presented by a multiport antenna array depends on the frequency and on the electromagnetic characteristics of the volume surrounding the antennas. In particular, if the multiport antenna array is built in a portable transceiver using multiple antennas simultaneously for MIMO communication, for instance a user equipment (UE) of an LTE wireless network, the impedance matrix presented by the multiport antenna array is affected by the user interaction.

Another antenna tuning apparatus, which may be referred to as "multiple-antenna-port and multiple-radio-port antenna tuning apparatus", is a passive apparatus intended to be inserted between a radio device using multiple antennas simultaneously in a frequency band, for instance a radio transmitter or a radio receiver for MIMO communication, and said multiple antennas, to obtain that the impedance matrix seen by the radio device matches a target value. FIG. 3 shows a block diagram of a typical use of such an antenna tuning apparatus (3) for simultaneously tuning 4 antennas (11) (12) (13) (14), the 4 antennas operating in a given frequency band, the 4 antennas forming an antenna array (1). In FIG. 3, the antenna tuning apparatus (3) comprises:

n=4 antenna ports (311) (321) (331) (341), each of the antenna ports being coupled to one of the antennas (11) (12) (13) (14) through a feeder (21) (22) (23) (24), the antenna ports seeing, at a frequency in said given frequency band, an impedance matrix referred to as the impedance matrix seen by the antenna ports;

m=4 radio ports (312) (322) (332) (342), each of the radio ports being coupled to the radio device (5) through an interconnection (41) (42) (43) (44), the radio ports presenting, at said frequency in said given frequency band, an impedance matrix referred to as the impedance matrix presented by the radio ports;

p adjustable impedance devices, where p is an integer typically greater than or equal to m, each of the adjustable impedance devices having a reactance at said frequency in said given frequency band, the reactance of any one of the adjustable impedance devices being adjustable and having an influence on the impedance matrix presented by the radio ports.

A multiple-antenna-port and multiple-radio-port antenna tuning apparatus behaves, at any frequency in the given frequency band, with respect to the n antenna ports and the m radio ports, substantially as a passive linear (n+m)-port device. Here "passive" is again used in the meaning of circuit theory, so that the multiple-antenna-port and multiple-radio-port antenna tuning apparatus does not provide amplification. In practice, losses are undesirable for signals applied to the antenna ports or the radio ports of a multiple-antenna-port and multiple-radio-port antenna tuning apparatus, in the given frequency band. Thus, an ideal multiple-antenna-port and multiple-radio-port antenna tuning apparatus is lossless for signals applied to its antenna ports or radio ports, in the given frequency band.

FIG. 4 shows a schematic diagram of an antenna tuning apparatus (3) which could be used as shown in FIG. 3 to tune 4 antennas, the antennas being used in a given frequency band. The antenna tuning apparatus shown in FIG. 4 comprises:

n=4 antenna ports (311) (321) (331) (341), each of the antenna ports being single-ended;

m=4 radio ports (312) (322) (332) (342), each of the radio ports being single-ended;

n adjustable impedance devices (301) each presenting a negative reactance and each being coupled in parallel with one of the antenna ports;

n (n−1)/2 adjustable impedance devices (302) each presenting a negative reactance and each having a first terminal coupled to one of the antenna ports and a second terminal coupled to one of the antenna ports which is different from the antenna port to which the first terminal is coupled;

n=m windings (303) each having a first terminal coupled to one of the antenna ports and a second terminal coupled to one of the radio ports;

m adjustable impedance devices (304) each presenting a negative reactance and each being coupled in parallel with one of the radio ports;

m (m−1)/2 adjustable impedance devices (305) each presenting a negative reactance and each having a first terminal coupled to one of the radio ports and a second terminal coupled to one of the radio ports which is different from the radio port to which the first terminal is coupled.

A multiple-antenna-port and multiple-radio-port antenna tuning apparatus of the type shown in FIG. 4 is disclosed in the French patent application number 12/02542 entitled "Appareil d'accord d'antenne pour un réseau d'antennes à accès multiples" and in the corresponding international application PCT/IB2013/058423 (WO 2014/049475) entitled "Antenna tuning apparatus for a multiport antenna array".

A multiple-antenna-port and multiple-radio-port antenna tuning apparatus may be used to compensate a variation in the impedance matrix seen by the antenna ports, caused by a variation in the frequency of operation, and/or to compensate the user interaction.

An antenna tuning apparatus may be such that the reactance value of any one of its adjustable impedance devices is adjusted manually. This type of manual tuning requires a skilled operator, and is for instance implemented to adjust some antenna tuning apparatuses for radio amateurs, having a single antenna port and a single radio port as shown in FIG. 1 and FIG. 2.

An antenna tuning apparatus may be such that the reactance of each of its adjustable impedance devices is adjustable by electrical means. Such an antenna tuning apparatus may be such that the reactance value of any one of its adjustable impedance devices is adjusted automatically or adaptively. In this case, if the antenna tuning apparatus and the circuits providing an automatic or adaptive adjustment of its adjustable impedance devices form a single device, this device may be referred to as "automatic antenna tuning apparatus", or "automatic antenna tuner" or "adaptive antenna tuner".

Automatic antenna tuning has been applied for a long time to an antenna tuning apparatus having a single antenna port and a single radio port, as shown in the patent of the U.S. Pat. No. 2,745,067 entitled "Automatic Impedance Matching Apparatus", and in the patent of the U.S. Pat. No. 4,493,112 entitled "Antenna Tuner Discriminator". Automatic antenna tuning applied to an antenna tuner having a single antenna port and a single radio port is also the subject matter of current research work, some of which is for instance described in said technical articles entitled "A Novel Method for Synthesizing an Automatic Matching Network and Its Control Unit", "An Analytical Algorithm for Pi-Network Impedance Tuners", and "A Self-Contained Adaptive Antenna Tuner for Mobile Phones".

Automatic antenna tuning has recently been applied to a multiple-antenna-port and multiple-radio-port antenna tuning apparatus, as shown in the patent of the U.S. Pat. No. 8,059,058 entitled "Antenna system and method for operating an antenna system", in the French patent application number 12/02564 entitled "Procédé et dispositif pour la réception radio utilisant un appareil d'accord d'antenne et une pluralité d'antennes", corresponding to the international application number PCT/IB2013/058574 (WO 2014/049486) entitled "Method and device for radio reception using an antenna tuning apparatus and a plurality of antennas", and in the French patent application number 13/00878 entitled "Procédé et appareil pour accorder automatiquement une matrice impédance, et émetteur radio utilisant cet appareil", corresponding to the international application number PCT/IB2014/058933 (WO 2014/170766) entitled "Method and apparatus for automatically tuning an impedance matrix, and radio transmitter using this apparatus".

However, an important limitation of the state of the art relating to antenna tuning (manual or automatic) using an antenna tuning apparatus is that an antenna tuning apparatus does not reduce any mismatch between an antenna and the feeder to which it is connected. The specialist understands that this situation implies that strong reflections may be present at both ends of the feeder, even when the antenna tuning apparatus is properly adjusted. The specialist understands that such reflections cause losses in the feeder, which degrade the performance of a radio system using the antenna and the feeder.

In the case of a radio device using a single antenna, the known solutions to this problem are: eliminating the feeder; using a feeder presenting low losses; or replacing the antenna and the antenna tuning apparatus with a tunable passive antenna. In the case of a radio device using multiple antennas simultaneously in a frequency band, none of these solutions is satisfactory. For instance, eliminating the feeders is not possible because the antennas are distant from each other, so that an antenna tuning apparatus cannot be near each of the antennas. For instance, feeders presenting low losses are expensive when they use low-loss dielectrics, and/or require too much space for most current applications. For instance, tunable passive antennas cannot be used to fully control the impedance matrix that they present, to obtain that the impedance matrix seen by a radio device approximates an arbitrary wanted matrix. In particular, when the interactions between the tunable passive antennas are not negligible, the impedance matrix presented by an array of tunable passive antennas is not diagonal. Thus, the tunable passive antennas can neither be used to obtain a wanted diagonal matrix, nor to fully compensate the user interaction. In particular, the specialist understands that, in the case of a mobile phone, none of said known solutions is satisfactory because a small size and a low cost are required, and because interactions between antennas are unavoidable.

SUMMARY OF THE INVENTION

The purposes of the invention are a method for radio communication and an apparatus for radio communication using a multiple-antenna-port and multiple-radio-port antenna tuning apparatus, without the above-mentioned limitations of known techniques.

The method of the invention is a method for radio communication with several antennas in a given frequency band, the method using an apparatus for radio communication that includes n antennas, where n is an integer greater than or equal to 2, the method comprising the steps of:
controlling one or more characteristics of at least one of the antennas, using at least one antenna control device, said at least one antenna control device being a part of said at least one of the antennas, said at least one antenna control device having at least one parameter having an influence on said one or more characteristics, said at least one parameter being adjustable by electrical means;
coupling said n antennas, directly or indirectly, to an antenna tuning apparatus comprising n antenna ports, m radio ports and p adjustable impedance devices, where m is an integer greater than or equal to 2 and where p is an integer greater than or equal to 2m, the p adjustable impedance devices being referred to as "the adjustable impedance devices of the antenna tuning apparatus" and being such that, at a frequency in said given frequency band, each of the adjustable impedance devices of the antenna tuning apparatus has a reactance, the reactance of any one of the adjustable impedance devices of the antenna tuning apparatus being adjustable by electrical means;
generating a "tuning instruction", the tuning instruction having an effect on each of said parameters, the tuning instruction having an effect on the reactance of each of the adjustable impedance devices of the antenna tuning apparatus.

In the previous sentence, "each of said parameters" clearly means "each said at least one parameter of each said at least one antenna control device of each said at least one of the antennas". In this sentence, "having an influence" and "having an effect" have the same meaning.

Each of the n antennas has a port, referred to as "the signal port of the antenna", comprising two terminals, which can be used to receive and/or to emit electromagnetic waves. Each of said at least one of the antennas comprises at least one antenna control device, which may comprise one or more other terminals used for other electrical connections. It is assumed that each of said n antennas behaves, at any frequency in the given frequency band, with respect to the signal port of the antenna, substantially as a passive antenna, that is to say as an antenna which is linear and does not use an amplifier for amplifying signals received by the antenna or signals emitted by the antenna. As a consequence of linearity, it is possible to define an impedance matrix presented by the n antennas, the definition of which only considers, for each of the antennas, the signal port of the antenna. This matrix is consequently of size n×n. Because of the interactions between the antennas, this matrix need not be diagonal. In particular, the invention may be such that this matrix is not a diagonal matrix.

Each of said one or more characteristics may for instance be an electrical characteristic such as an impedance at a specified frequency, or an electromagnetic characteristic such as a directivity pattern at a specified frequency. Each of said at least one of the antennas comprises at least one antenna control device having at least one parameter having an effect on one or more characteristics of said each of said at least one of the antennas, said at least one parameter being adjustable by electrical means. Thus, the specialist understands that each of said at least one of the antennas is a tunable passive antenna. A tunable passive antenna may also be referred to as "reconfigurable antenna". Some authors consider three classes of tunable passive antennas: polarization-agile antennas, pattern-reconfigurable antennas and frequency-agile antennas. The state of the art regarding frequency-agile antennas is for instance described in the article of A. Petosa entitled "An Overview of Tuning Techniques for Frequency-Agile Antennas", published in *IEEE Antennas and Propagation Magazine*, vol. 54, No. 5, in October 2012.

Each of said n antennas may be coupled, directly or indirectly, to one and only one of the antenna ports of the antenna tuning apparatus. More precisely, for each of said n antennas, the signal port of the antenna may be coupled, directly or indirectly, to one and only one of the antenna ports of the antenna tuning apparatus. For instance, an indirect coupling may be a coupling through a feeder and/or through a directional coupler. The antenna control devices and the antenna tuning apparatus may be used to tune said n antennas.

The tuning instruction may comprise any type of electrical signal and/or any combination of such electrical signals. The tuning instruction may be generated automatically within the apparatus for radio communication.

An apparatus implementing the method of the invention is an apparatus for radio communication using several antennas in a given frequency band, the apparatus for radio communication comprising:

n antennas, where n is an integer greater than or equal to 2, at least one tunable passive antenna being among said n antennas, said at least one tunable passive antenna comprising at least one antenna control device, one or more characteristics of said at least one tunable passive antenna being controlled using said at least one antenna control device, said at least one antenna control device having at least one parameter having an influence on said one or more characteristics, said at least one parameter being adjustable by electrical means;

an antenna tuning apparatus comprising n antenna ports, m radio ports and p adjustable impedance devices, where m is an integer greater than or equal to 2 and where p is an integer greater than or equal to 2m, the p adjustable impedance devices being referred to as "the adjustable impedance devices of the antenna tuning apparatus" and being such that, at a frequency in said given frequency band, each of the adjustable impedance devices of the antenna tuning apparatus has a reactance, the reactance of any one of the adjustable impedance devices of the antenna tuning apparatus being adjustable by electrical means;

a processing unit, the processing unit delivering a "tuning instruction";

a tuning control unit, the tuning control unit receiving the tuning instruction, the tuning control unit delivering a plurality of "tuning control signals", the tuning control signals being determined as a function of the tuning instruction, the reactance of each of the adjustable impedance devices of the antenna tuning apparatus being mainly determined by one or more of the tuning control signals, each of said parameters being mainly determined by one or more of the tuning control signals.

In the previous sentence, "each of said parameters" clearly means "each said at least one parameter of each said at least one antenna control device of each said at least one tunable passive antenna". In this sentence, "having an influence" has the same meaning as "having an effect".

The radio ports present, at said frequency in said given frequency band, an impedance matrix referred to as "the impedance matrix presented by the radio ports", and the antenna ports see, at said frequency in said given frequency band, an impedance matrix referred to as "the impedance matrix seen by the antenna ports". It is assumed that said antenna tuning apparatus behaves, at any frequency in the given frequency band, with respect to its antenna ports and its radio ports, substantially as a passive linear device (where "passive" is used in the meaning of circuit theory). More precisely, said antenna tuning apparatus behaves, at any frequency in the given frequency band, with respect to the n antenna ports and the m radio ports, substantially as a passive linear (n+m)-port device. As a consequence of linearity, it is possible to define the impedance matrix presented by the radio ports. As a consequence of passivity, the antenna tuning apparatus does not provide amplification.

An adjustable impedance device is a component comprising two terminals which substantially behave as a passive linear two-terminal circuit element, and which are consequently fully characterized by an impedance which may depend on frequency, this impedance being adjustable. An adjustable impedance device may be adjustable by mechanical means, for instance a variable resistor, a variable capacitor, a network comprising a plurality of capacitors and one or more switches or change-over switches used to cause different capacitors of the network to contribute to the reactance, a variable inductor, a network comprising a plurality of inductors and one or more switches or change-over switches used to cause different inductors of the network to contribute to the reactance, or a network comprising a plurality of open-circuited or short-circuited stubs and one or more switches or change-over switches used to cause different stubs of the network to contribute to the reactance. We note that all examples in this list, except the variable resistor, are intended to provide an adjustable reactance.

An adjustable impedance device having a reactance which is adjustable by electrical means may be such that it only provides, at said frequency in said given frequency band, a finite set of reactance values, this characteristic being for instance obtained if the adjustable impedance device is:

a network comprising a plurality of capacitors or open-circuited stubs and one or more electrically controlled switches or change-over switches, such as electromechanical relays, or microelectromechanical switches (MEMS switches), or PIN diodes or insulated-gate field-effect transistors (MOSFETs), used to cause different capacitors or open-circuited stubs of the network to contribute to the reactance; or a network comprising a plurality of coils or short-circuited stubs and one or more electrically controlled switches or change-over switches used to cause different coils or short-circuited stubs of the network to contribute to the reactance.

An adjustable impedance device having a reactance which is adjustable by electrical means may be such that it provides, at said frequency in said given frequency band, a continuous set of reactance values, this characteristic being for instance obtained if the adjustable impedance device is based on the use of a variable capacitance diode; or a MOS varactor; or a microelectromechanical varactor (MEMS varactor); or a ferroelectric varactor.

The antenna tuning apparatus may be such that the reactance of any one of the adjustable impedance devices of the antenna tuning apparatus has, at said frequency in said given frequency band, if the impedance matrix seen by the antenna ports is equal to a given diagonal impedance matrix, an influence on the impedance matrix presented by the radio ports. This must be interpreted as meaning: the antenna tuning apparatus may be such that, at said frequency in said given frequency band, there exists a diagonal impedance matrix referred to as the given diagonal impedance matrix, the given diagonal impedance matrix being such that, if the impedance matrix seen by the antenna ports is equal to the given diagonal impedance matrix, then the reactance of any one of the adjustable impedance devices of the antenna tuning apparatus has an influence on the impedance matrix presented by the radio ports.

As explained in said article of A. Petosa, many different types of antenna control device may be used to control one or more characteristics of any one of the tunable passive antennas. A suitable antenna control device may for instance be:

an electrically controlled switch or change-over switch, in which case a parameter of the antenna control device having an influence on one or more characteristics of the tunable passive antenna may be the state of the switch or change-over switch;

an adjustable impedance device, in which case a parameter of the antenna control device having an influence on one or more characteristics of the tunable passive antenna may be the reactance or the impedance of the adjustable impedance device at a specified frequency; or an actuator arranged to produce a mechanical deformation of the tunable passive antenna, in which case a parameter of the antenna control device having an influence on one or more characteristics of the tunable passive antenna may be a length of the deformation.

If an antenna control device is an electrically controlled switch or change-over switch, it may for instance be an electro-mechanical relay, or a microelectromechanical switch (MEMS switch), or a circuit using one or more PIN diodes or one or more insulated-gate field-effect transistors (MOSFETs) as switching devices.

BRIEF DESCRIPTION OF THE DRAWINGS

Other advantages and characteristics will appear more clearly from the following description of particular embodiments of the invention, given by way of non-limiting examples, with reference to the accompanying drawings in which.

DETAILED DESCRIPTION OF SOME EMBODIMENTS

First Embodiment.

Figure 5:
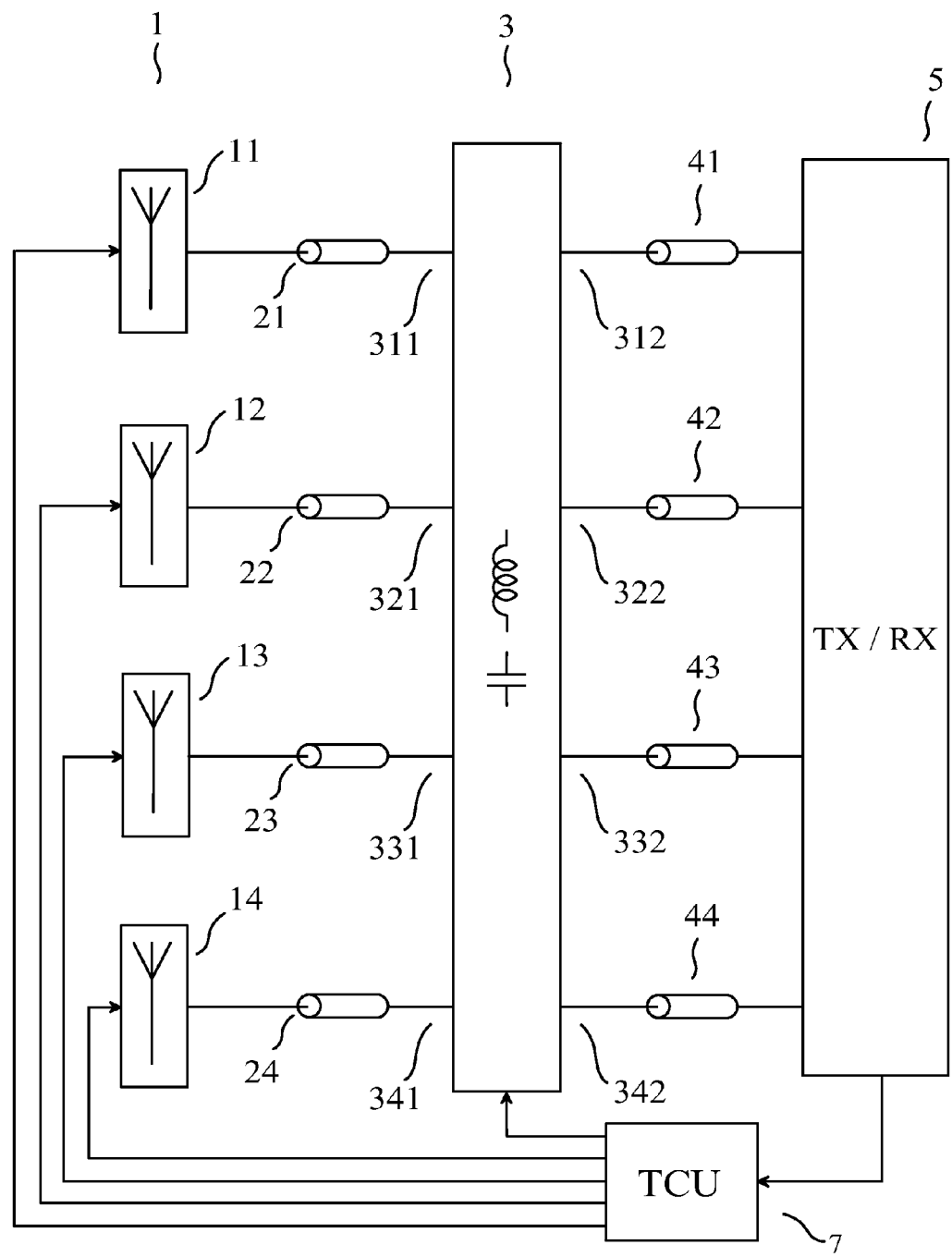
FIG. 5 shows a block diagram of a transceiver for radio communication of the invention, which simultaneously uses 4 tunable passive antennas.

As a first embodiment of an apparatus of the invention, given by way of non-limiting example, we have represented in FIG. 5 the block diagram of a portable apparatus for radio communication, the apparatus for radio communication being a transceiver comprising:

n=4 antennas (11) (12) (13) (14), the n antennas operating simultaneously in a given frequency band, the n antennas forming an antenna array (1), each of the n antennas being a tunable passive antenna comprising at least one antenna control device, one or more characteristics of said tunable passive antenna being controlled using said at least one antenna control device, said at least one antenna control device having at least one parameter having an effect on said one or more characteristics, said at least one parameter being adjustable by electrical means;

a radio device (5) which consists of all parts of the apparatus for radio communication which are not shown elsewhere in FIG. 5;

an antenna tuning apparatus (3), the antenna tuning apparatus being a multiple-antenna-port and multiple-radio-port antenna tuning apparatus, the antenna tuning apparatus comprising n=4 antenna ports (311) (321) (331) (341), each of the antenna ports being coupled to one of the antennas through a feeder (21) (22) (23) (24), the antenna tuning apparatus comprising m=4 radio ports (312) (322) (332) (342), each of the radio ports being coupled to the radio device (5) through an interconnection (41) (42) (43) (44), the antenna tuning apparatus comprising p adjustable impedance devices, where p is an integer greater than or equal to 2m, the p adjustable impedance devices being referred to as "the adjustable impedance devices of the antenna tuning apparatus" and being such that, at a frequency in said given frequency band, each of the adjustable impedance devices of the antenna tuning apparatus has a reactance, the reactance of any one of the adjustable impedance devices of the antenna tuning apparatus being adjustable by electrical means;

a tuning control unit (7), the tuning control unit receiving a "tuning instruction" generated automatically within the apparatus for radio communication, the tuning control unit delivering a plurality of "tuning control signals" to the antenna tuning apparatus and the tunable passive antennas, the tuning control signals being determined as a function of the tuning instruction, the reactance of each of the adjustable impedance devices of the antenna tuning apparatus being mainly determined by one or more of the tuning control signals, each of said parameters being mainly determined by one or more of the tuning control signals.

The tuning instruction is generated repeatedly by the radio device (5). For instance, the tuning instruction may be generated periodically, for instance every 10 milliseconds. The tuning instruction is such that, at the frequency of operation, the values of each of said parameters reduce the mismatch between each antenna and the feeder to which it is coupled. The tuning instruction is also such that, at the frequency of operation, the impedance matrix presented by the radio ports is close to a specified matrix.

The tuning instruction is a function of one or more variables or quantities such as: information on the efficiency of one or more of the antennas, information on isolation between antennas, one or more operational factors of the apparatus for radio communication, and/or one or more performance metrics of the apparatus for radio communication. The specialist knows how to obtain and use such one or more variables or quantities. The following eighth, ninth, tenth and eleventh embodiments are examples in which such one or more variables or quantities are obtained and used.

Thus, the specialist understands how the tuning instruction can be determined as a function of said one or more variables or quantities, taking into account the characteristics of each tunable passive antenna, the interactions between the antennas, and the characteristics of the antenna tuning apparatus.

The specified matrix is such that the impedance matrix seen by the radio device (5) approximates an arbitrary wanted matrix. The specified matrix may for instance be a diagonal matrix. The specialist understands that this overcomes the above-mentioned limitations of known techniques, because, in this first embodiment, no strong reflection is present at both ends of each of the feeders, so that the losses in the feeders are reduced, and because the impedance matrix seen by the radio device approximates an arbitrary wanted matrix.

The body of the user has an effect on the impedance matrix presented by the antenna array, and this impedance matrix depends on the position of the body of the user. As said above in the prior art section, this is referred to as "user interaction", or "hand effect" or "finger effect", like the effect of the user's body on the impedance presented by a single antenna. Since the impedance matrix seen by the radio device can approximate an arbitrary wanted matrix in spite of the user interaction, the invention compensates the user interaction.

The specialist understands that an optimal value of the reactance of each of the adjustable impedance devices of the antenna tuning apparatus depends on the value of each of said parameters, and that, conversely, an optimal value of each of said parameters depends on the value of the reactance of each of the adjustable impedance devices of the antenna tuning apparatus. The specialist sees that, because of this interaction, a method used to determine the tuning instruction is necessarily different from any method used in a prior art apparatus for radio communication which would comprise a multiple-antenna-port and multiple-radio-port antenna tuning apparatus but no tunable passive antenna, such as the prior art apparatuses for radio communication disclosed in said French patent application number 12/02564, in said international application number PCT/IB2013/058574, in said French patent application number 13/00878 or in said international application number PCT/IB2014/058933. According to the invention, a possible method would for instance determine a coarse antenna tuning using a value of each of said parameters, and thereafter a fine antenna tuning using a value of the reactance of each of the adjustable impedance devices of the antenna tuning apparatus. The specialist also sees that, because of this interaction, the requirements applicable to the antenna tuning apparatus (3) used in the invention may be easier to meet than the requirements applicable to an antenna tuning apparatus used in a prior art apparatus for radio communication which would comprise a multiple-antenna-port and multiple-radio-port antenna tuning apparatus but no tunable passive antenna. For instance, if said possible method is used, the antenna tuning apparatus (3) used in the invention is only used to obtain a fine tuning, so that the range of reactance values required for each of the adjustable impedance devices of the antenna tuning apparatus is reduced, and an improved accuracy is obtained.

In this first embodiment, n=m=4. Thus, it is possible that n is greater than or equal to 3, it is possible that n is greater than or equal to 4, it is possible that m is greater than or equal to 3, and it is possible that m is greater than or equal to 4.

In this first embodiment, the number of tunable passive antennas is equal to 4. Thus, it is possible that the number of tunable passive antennas is greater than or equal to 2, and it is possible that the number of tunable passive antennas is greater than or equal to 3. It is possible that the number of tunable passive antennas is equal to n.

Second Embodiment.

The second embodiment of an apparatus of the invention, given by way of non-limiting example, also corresponds to the portable apparatus for radio communication represented in FIG. 5, and all explanations provided for the first embodiment are applicable to this second embodiment.

Figure 6:
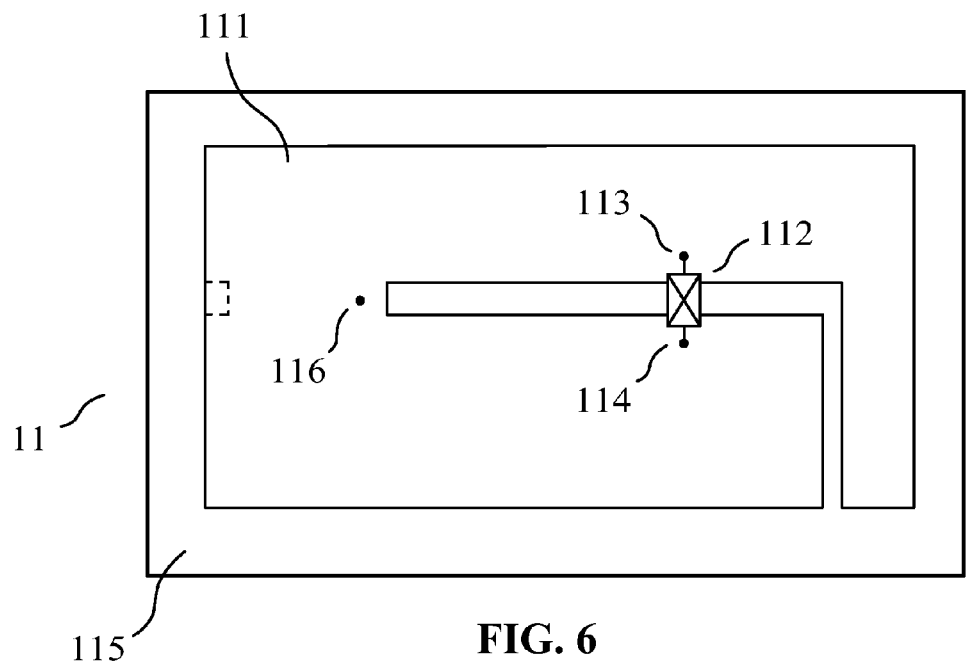
FIG. 6 shows a first tunable passive antenna, which comprises a single antenna control device.

An antenna (11) used in this second embodiment is shown in FIG. 6. The other antennas (12) (13) (14) used in this second embodiment may be identical to the antenna shown in FIG. 6. The antenna shown in FIG. 6 is a tunable passive antenna comprising a planar metallic structure (111) built above a ground plane (115), a feeder connection point (116) where an unbalanced feeder is connected to the metallic structure, and an antenna control device (112). The metallic structure is slotted and such that, if the antenna control device was not present, the antenna would be an example of a planar inverted-F antenna, also referred to as PIFA. The antenna control device is a MEMS switch comprising a first terminal (113) connected to the metallic structure (111) at a first side of the slot, and a second terminal (114) connected to the metallic structure (111) at a second side of the slot. The specialist understands that the antenna self-impedance, in a given test configuration and at a given frequency, is a characteristic of the tunable passive antenna which may be varied using said antenna control device, so that this characteristic is controlled using said antenna control device. The state of the MEMS switch (on or off) is a parameter of the antenna control device which has an influence on said characteristic. This parameter of the antenna control device is adjustable by electrical means, but the circuits and the control links needed to determine the state of the antenna control device are not shown in FIG. 6.

Third Embodiment.

The third embodiment of an apparatus of the invention, given by way of non-limiting example, also corresponds to the portable apparatus for radio communication represented in FIG. 5, and all explanations provided for the first embodiment are applicable to this third embodiment.

Figure 7:
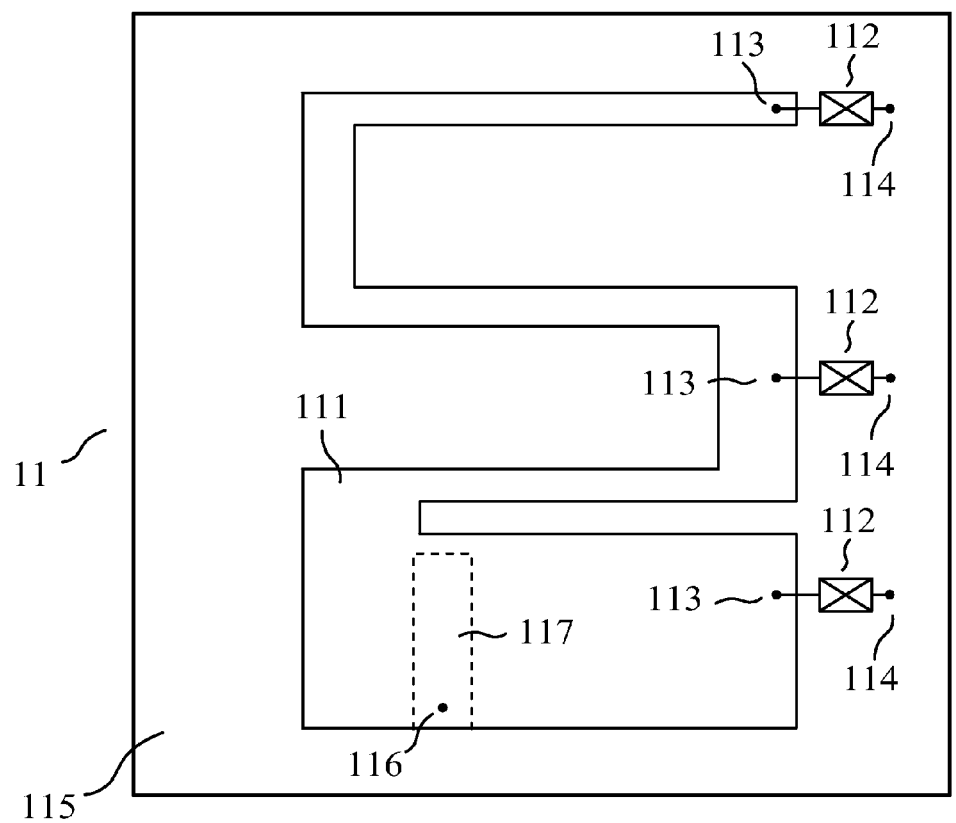
FIG. 7 shows a second tunable passive antenna, which comprises three antenna control devices.

An antenna (11) used in this third embodiment is shown in FIG. 7. The other antennas (12) (13) (14) used in this third embodiment may be identical to the antenna shown in FIG. 6 or to the antenna shown in FIG. 7. The antenna shown in FIG. 7 is a tunable passive antenna comprising a planar metallic structure (111) built above a ground plane (115), a feeder connection point (116) where an unbalanced feeder is connected to a metallic strip (117) lying between the ground plane and the metallic structure, and three antenna control devices (112). Each of the antenna control devices is an adjustable impedance device having a reactance at a given frequency, comprising a first terminal (113) connected to the metallic structure (111), and a second terminal (114) connected to the ground plane (115). The specialist understands that the antenna self-impedance, in a given test configuration and at the given frequency, is a characteristic of the tunable passive antenna which may be varied using said antenna control devices, so that this characteristic is controlled using said antenna control devices. Each of the antenna control devices has a reactance at the given frequency, this reactance being a parameter of said each of the antenna control devices, this parameter having an influence on said characteristic. This parameter of each of the antenna control devices is adjustable by electrical means, but the circuits and the control links needed to determine the reactance of each of the antenna control devices are not shown in FIG. 7.

Fourth Embodiment.

The fourth embodiment of an apparatus of the invention, given by way of non-limiting example, also corresponds to the portable apparatus for radio communication represented in FIG. 5, and all explanations provided for the first embodiment are applicable to this fourth embodiment.

Figure 8:
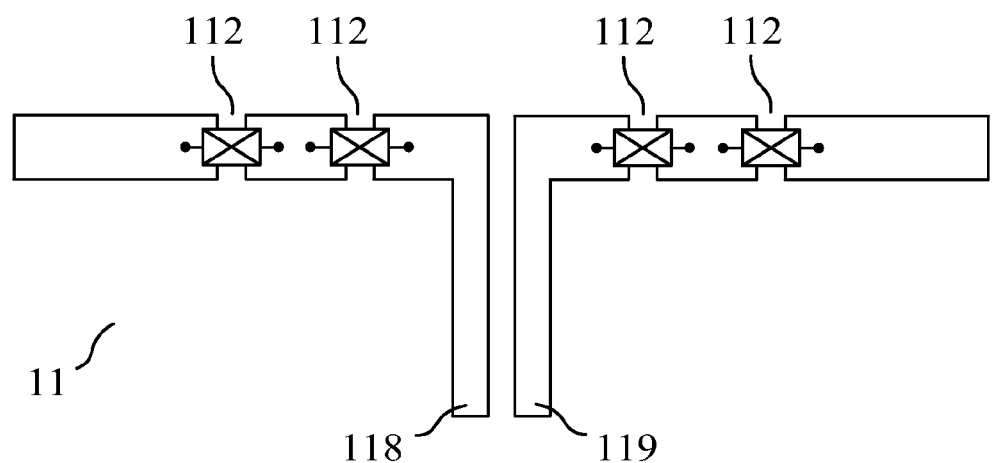
FIG. 8 shows a third tunable passive antenna, which comprises four antenna control devices.

An antenna (11) used in this fourth embodiment is shown in FIG. 8. The other antennas (12) (13) (14) used in this fourth embodiment may be identical to the antenna shown in FIG. 6, or to the antenna shown in FIG. 7, or to the antenna shown in FIG. 8. The antenna (11) shown in FIG. 8 is a tunable passive antenna having a plane of symmetry orthogonal to the drawing. Thus, the antenna has a first half-antenna, on the left in FIG. 8, and a second half-antenna, on the right in FIG. 8. The antenna comprises a first terminal (118) where a first conductor of a balanced feeder is connected to the first half-antenna, and a second terminal (119) where a second conductor of the balanced feeder is connected to the second half-antenna. Each half-antenna includes three segments and two antenna control devices (112). Each of the antenna control devices is an adjustable impedance device having a reactance at a given frequency, comprising a first terminal connected to a segment of an half-antenna, and a second terminal connected to another segment of this half-antenna. The specialist understands that the antenna self-impedance, in a given test configuration and at the given frequency, is a characteristic of the tunable passive antenna which may be varied using said antenna control devices, so that this characteristic is controlled using said antenna control devices. Each of the antenna control devices has a reactance at the given frequency, this reactance being a parameter of said each of the antenna control devices, this parameter having an influence on said characteristic. This parameter of each of the antenna control devices is adjustable by electrical means, but the circuits and the control links needed to determine the reactance of each of the antenna control devices are not shown in FIG. 8.

Fifth Embodiment.

The fifth embodiment of an apparatus of the invention, given by way of non-limiting example, also corresponds to the portable apparatus for radio communication represented in FIG. 5, and all explanations provided for the first embodiment are applicable to this fifth embodiment.

Figure 9:
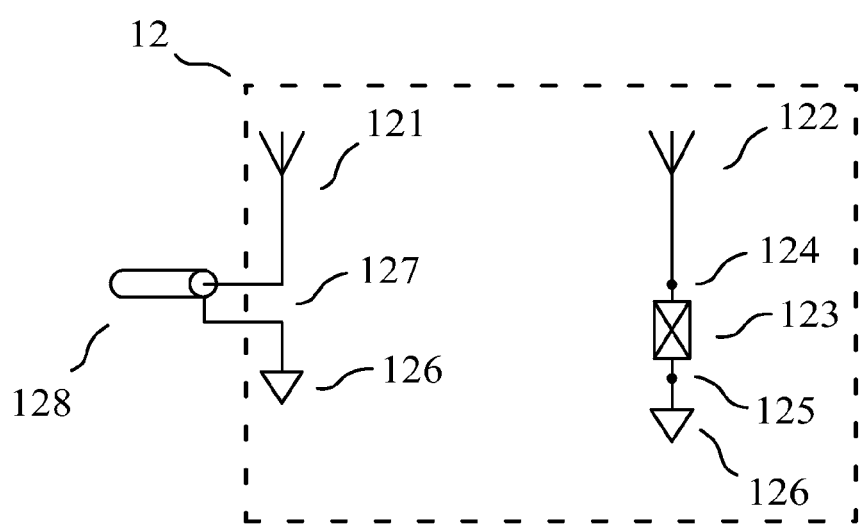
FIG. 9 shows a fourth tunable passive antenna, which comprises a single antenna control device.

An antenna (12) used in this fifth embodiment is shown in FIG. 9. The other antennas (11) (13) (14) used in this fifth embodiment may be identical to the antenna shown in FIG. 9. The antenna (12) shown in FIG. 9 is a tunable passive antenna comprising a main antenna (121), a parasitic antenna (122), a feeder connection point (127) where an unbalanced feeder (128) is connected to the main antenna and to ground (126), and an antenna control device (123). The antenna control device is an adjustable impedance device having a reactance at a given frequency, comprising a first terminal (124) connected to the parasitic antenna (122), and a second terminal (125) connected to ground (126). The specialist understands that the directivity pattern of the antenna (12), in a given test configuration and at the given frequency, is a characteristic of the tunable passive antenna which may be varied using said antenna control device, so that this characteristic is controlled using said antenna control device. The reactance of the antenna control device at the given frequency is a parameter of said antenna control device which has an influence on said characteristic. This parameter of the antenna control device is adjustable by electrical means, but the circuits and the control links needed to determine the reactance of the antenna control device are not shown in FIG. 9. The antenna (12) could also comprise other parasitic antennas each coupled to an antenna control device.

Sixth Embodiment.

The sixth embodiment of an apparatus of the invention, given by way of non-limiting example, also corresponds to the portable apparatus for radio communication represented in FIG. 5, and all explanations provided for the first embodiment are applicable to this sixth embodiment.

In this sixth embodiment, the antenna tuning apparatus (3) is an antenna tuning apparatus disclosed in said French patent application number 12/02542 and said international application PCT/IB2013/058423. Thus, the antenna tuning apparatus (3) is such that the reactance of any one of the adjustable impedance devices of the antenna tuning apparatus has, at said frequency in said given frequency band, if the impedance matrix seen by the antenna ports is equal to a given diagonal impedance matrix, an influence on the impedance matrix presented by the radio ports, and such that the reactance of at least one of the adjustable impedance devices of the antenna tuning apparatus has, at said frequency in said given frequency band, if the impedance matrix seen by the antenna ports is equal to the given diagonal impedance matrix, an influence on at least one non-diagonal entry of the impedance matrix presented by the radio ports. This must be interpreted as meaning: the antenna tuning apparatus is such that, at said frequency in said given frequency band, there exists a diagonal impedance matrix referred to as the given diagonal impedance matrix, the given diagonal impedance matrix being such that, if an impedance matrix seen by the antenna ports is equal to the given diagonal impedance matrix, then (a) the reactance of any one of the adjustable impedance devices of the antenna tuning apparatus has an influence on an impedance matrix presented by the radio ports, and (b) the reactance of at least one of the adjustable impedance devices of the antenna tuning apparatus has an influence on at least one non-diagonal entry of the impedance matrix presented by the radio ports. In the two previous sentences, "an influence" could be replaced with "an effect".

The specialist understands that the antenna tuning apparatus (3) cannot be made up of a plurality of independent and uncoupled antenna tuning apparatuses each having a single antenna port and a single radio port, because in this case, if the impedance matrix seen by the antenna ports is equal to any diagonal impedance matrix, then the impedance matrix presented by the radio ports is a diagonal matrix, the non-diagonal entries of which cannot be influenced by anything.

Moreover, the antenna tuning apparatus (3) is such that, at said frequency in said given frequency band, if the impedance matrix seen by the antenna ports is equal to a given non-diagonal impedance matrix, a mapping associating the impedance matrix presented by the radio ports to the p reactances is defined, the mapping having, at a given value of each of the p reactances, a partial derivative with respect to each of the p reactances, a span of the p partial derivatives being defined in the set of the complex matrices of size m×m considered as a real vector space, any diagonal complex matrix of size m×m having the same diagonal entries as at least one element of the span of the p partial derivatives. This must be interpreted as meaning: the antenna tuning apparatus is such that, at said frequency in said given frequency band, there exists a non-diagonal impedance matrix referred to as the given non-diagonal impedance matrix, the given non-diagonal impedance matrix being such that, if an impedance matrix seen by the antenna ports is equal to the given non-diagonal impedance matrix, then a mapping associating an impedance matrix presented by the radio ports to the p reactances is defined, the mapping having, at a given value of each of the p reactances, a partial derivative with respect to each of the p reactances, a span of the p partial derivatives being defined in the set of the complex matrices of size m×m considered as a real vector space, any diagonal complex matrix of size m×m having the same diagonal entries as at least one element of the span of the p partial derivatives.

The specialist knows that the dimension of the span of the p partial derivatives considered as a real vector space has been used and explained: in said French patent application number 12/02542; in said international application PCT/IB2013/058423; and in the sections I, III, VI, VII and VIII of the article of F. Broydé and E. Clavelier entitled "Some Properties of Multiple-Antenna-Port and Multiple-User-Port Antenna Tuners", published in *IEEE Trans. on Circuits and Systems—I: Regular Papers*, Vol. 62, No. 2, pp. 423-432, in February 2015, where said dimension of the span of the p partial derivatives is referred to as the local dimension of the user port impedance range, and denoted by $D_{UR}$ ($Z_{Sant}$).

Consequently, the specialist understands that it is possible to reduce the losses in the feeders and to simultaneously obtain that the impedance matrix seen by a radio device approximates an arbitrary wanted matrix. Thus, the specialist understands that any small variation in the impedance matrix of the antenna array, caused by a change in operating frequency or a change in the medium surrounding the antennas, can be at least partially compensated with a new adjustment of the antenna control devices and of the adjustable impedance devices of the antenna tuning apparatus.

More generally, a specialist understands that, to obtain that any diagonal complex matrix of size m×m has the same diagonal entries as at least one element of the span of the p partial derivatives, it is necessary that the dimension of the span of the p partial derivatives considered as a real vector space is greater than or equal to the dimension of the subspace of the diagonal complex matrices of size m×m considered as a real vector space. Since the dimension of the span of the p partial derivatives considered as a real vector space is less than or equal to p, and since the dimension of the subspace of the diagonal complex matrices of size m×m considered as a real vector space is equal to 2m, the necessary condition implies that p is an integer greater than or equal to 2m. This is why the requirement "p is an integer greater than or equal to 2m" is an essential characteristic of the invention.

Seventh Embodiment (best mode).

The seventh embodiment of an apparatus of the invention, given by way of non-limiting example and best mode of carrying out the invention, also corresponds to the portable apparatus for radio communication represented in FIG. 5, and all explanations provided for the first embodiment and the sixth embodiment are applicable to this seventh embodiment. Additionally, the antenna tuning apparatus (3) used in this seventh embodiment corresponds to the schematic diagram shown in FIG. 4. This antenna tuning apparatus comprises:

n=4 antenna ports (311) (321) (331) (341), each of the antenna ports being single-ended;

m=4 radio ports (312) (322) (332) (342), each of the radio ports being single-ended;

n adjustable impedance devices (301) each presenting a negative reactance and each being coupled in parallel with one of the antenna ports;

n (n−1)/2 adjustable impedance devices (302) each presenting a negative reactance and each having a first terminal coupled to one of the antenna ports and a second terminal coupled to one of the antenna ports which is different from the antenna port to which the first terminal is coupled;

n=m windings (303) each having a first terminal coupled to one of the antenna ports and a second terminal coupled to one of the radio ports;

m adjustable impedance devices (304) each presenting a negative reactance and each being coupled in parallel with one of the radio ports;

m (m−1)/2 adjustable impedance devices (305) each presenting a negative reactance and each having a first terminal coupled to one of the radio ports and a second terminal coupled to one of the radio ports which is different from the radio port to which the first terminal is coupled.

It is possible that mutual induction exists between the windings (303). In this case, the inductance matrix of the windings is not a diagonal matrix.

Figure 1:
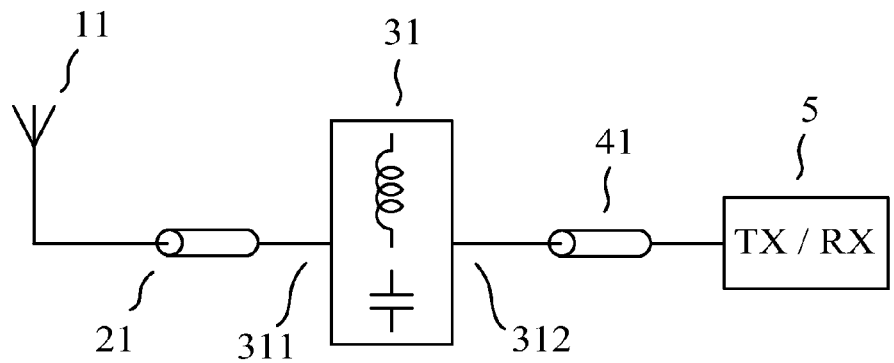
FIG. 1 shows a block diagram of a typical use of an antenna tuning apparatus for tuning a single antenna, and has already been discussed in the section dedicated to the presentation of the prior art.
Figure 2:
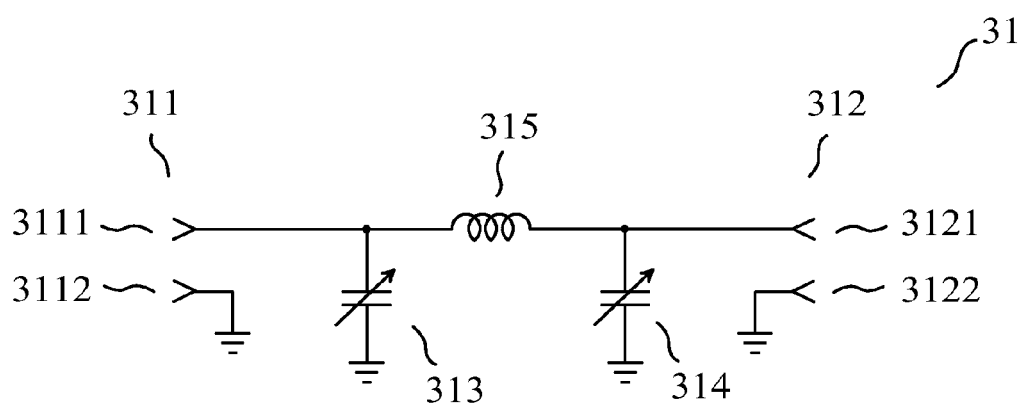
FIG. 2 shows a schematic diagram of an antenna tuning apparatus which could be used as shown in FIG. 1 to tune a single antenna, and has already been discussed in the section dedicated to the presentation of the prior art.
Figure 3:
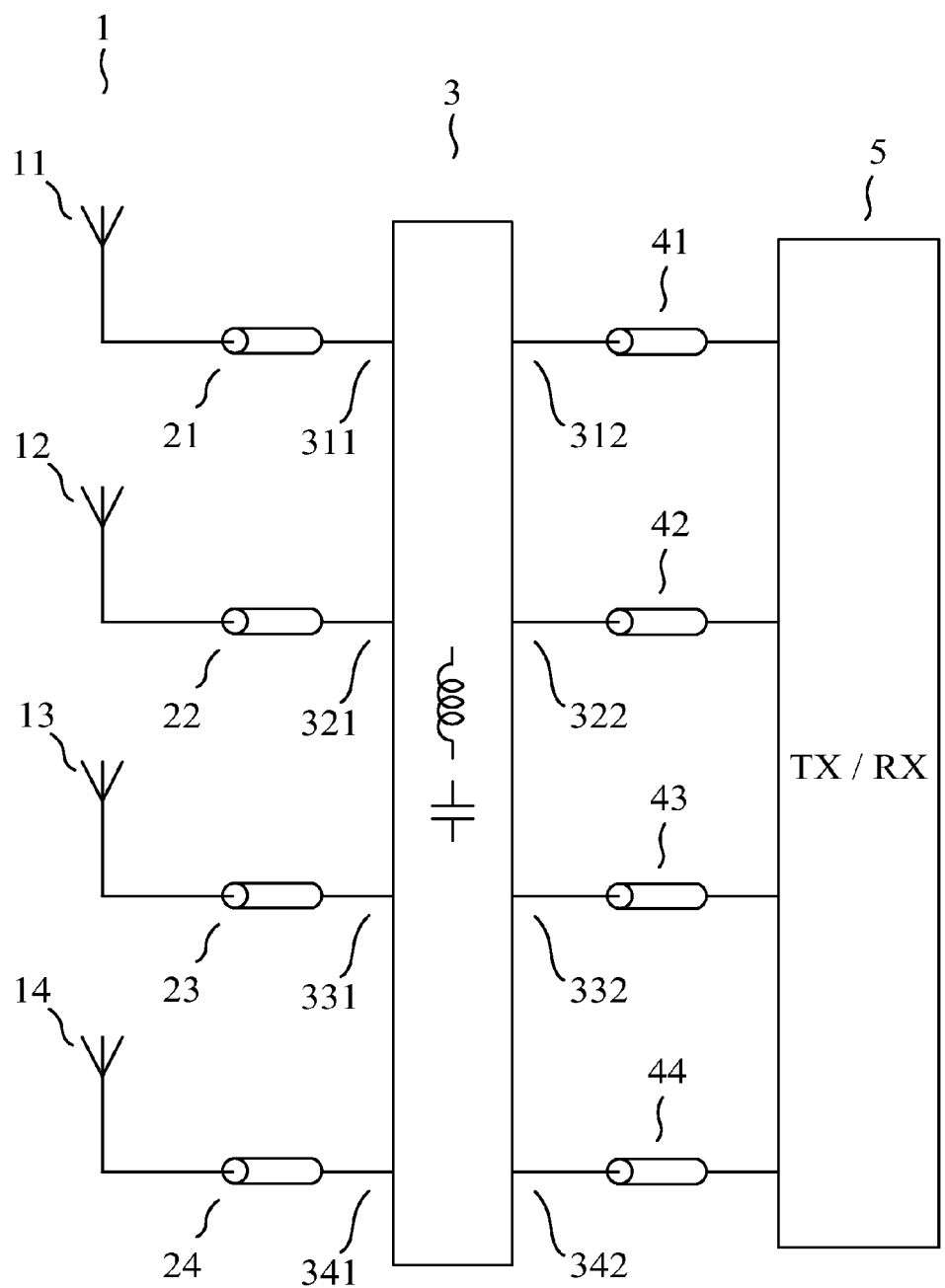
FIG. 3 shows a block diagram of a typical use of an antenna tuning apparatus for simultaneously tuning 4 antennas, and has already been discussed in the section dedicated to the presentation of the prior art.
Figure 4:
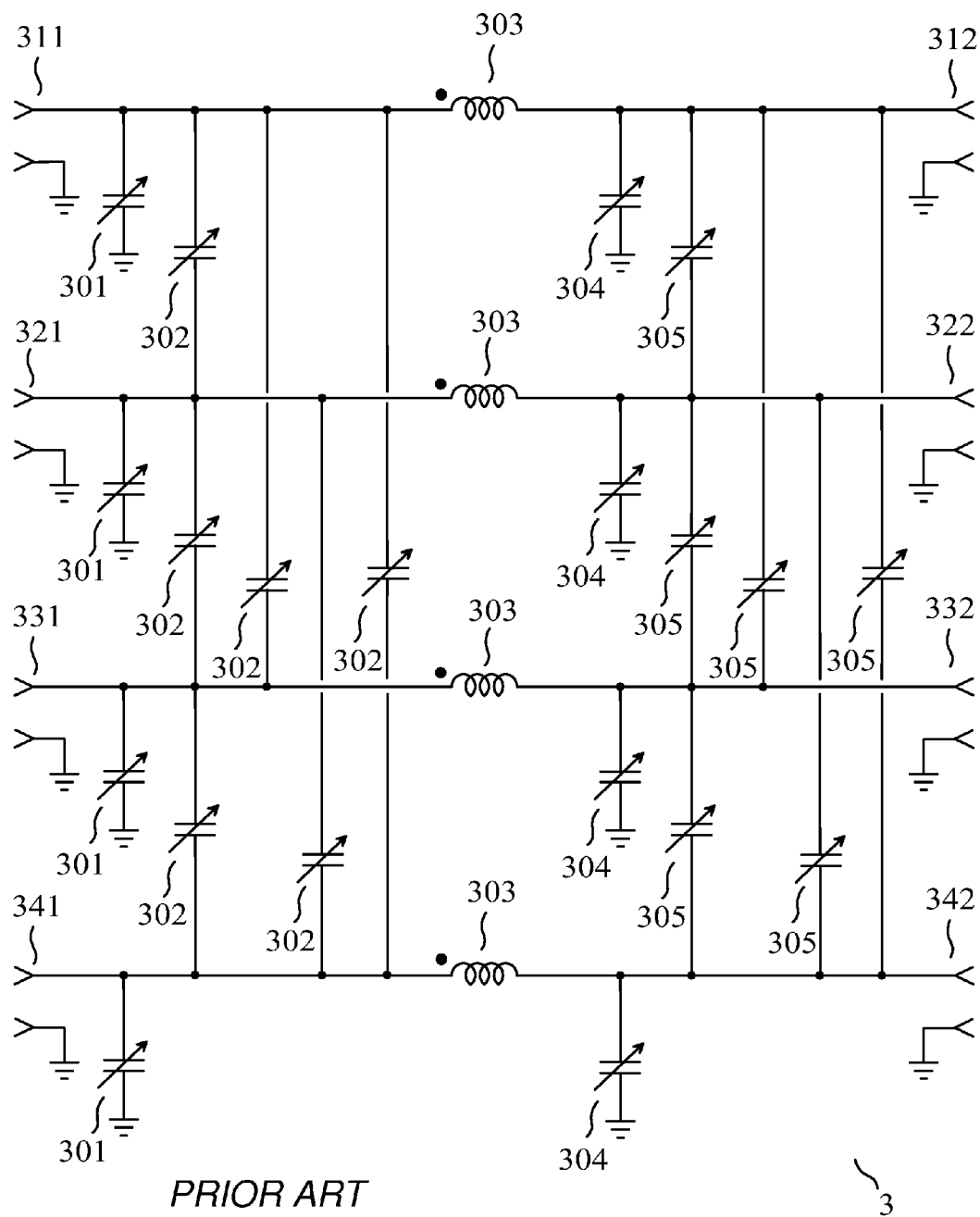
FIG. 4 shows a schematic diagram of an antenna tuning apparatus which could be used as shown in FIG. 3 to simultaneously tune 4 antennas, and has already been discussed in the section dedicated to the presentation of the prior art.

All adjustable impedance devices of the antenna tuning apparatus (301) (302) (304) (305) are adjustable by electrical means, but the circuits and the control links needed to determine the reactance of each of the adjustable impedance devices of the antenna tuning apparatus are not shown in FIG. 4. In this seventh embodiment, we have n=m and we use p=m (m+1)=20 adjustable impedance devices of the antenna tuning apparatus.

The specialist understands that, at a frequency at which the antenna tuning apparatus is intended to operate, if the impedance matrix seen by the antenna ports is a diagonal matrix having all its diagonal entries equal to 50Ω, the reactance of any one of the adjustable impedance devices of the antenna tuning apparatus has an influence on the impedance matrix presented by the radio ports, and the reactance of one or more of the adjustable impedance devices of the antenna tuning apparatus has an influence on one or more of the non-diagonal entries of the impedance matrix presented by the radio ports.

The impedance matrix seen by the antenna ports being a given symmetric complex matrix, it is possible to show that, for suitable component values, the p partial derivatives defined above in the section on the sixth embodiment are linearly independent in the real vector space of the complex matrices of size m×m, this vector space, denoted by E, being of dimension 2 m². Thus, the span of the p partial derivatives in E is a subspace of dimension p equal to the set of the symmetric complex matrices of size m×m. Here, any symmetric complex matrix of size m×m is an element of the span of the p partial derivatives. Consequently, any diagonal complex matrix of size m×m has the same diagonal entries as at least one element of the span of the p partial derivatives.

The reactance of an adjustable impedance device of the antenna tuning apparatus may depend on the ambient temperature, for some types of adjustable impedance devices. In a similar way, said at least one parameter of an antenna control device may depend on the ambient temperature. The tuning control signals are determined as a function of the tuning instruction and as a function of temperature, to compensate the effect of temperature on the reactance of at least one of the adjustable impedance devices of the antenna tuning apparatus and/or to compensate the effect of temperature on at least one of said parameters of at least one of said antenna control devices.

A tuning instruction is generated periodically, at the end of a tuning sequence, and is valid until a next tuning instruction is generated at the end of a next tuning sequence.

The specialist understands that, as explained in said article entitled "Some Properties of Multiple-Antenna-Port and Multiple-User-Port Antenna Tuners" and in the article of F. Broydé and E. Clavelier entitled "A New Multiple-Antenna-Port and Multiple-User-Port Antenna Tuner", published in the proceedings of the 2015 *IEEE Radio & Wireless Week, RWW* 2015, in January 2015, any small variation in the impedance matrix of the antenna array, caused by a change in operating frequency or a change in the medium surrounding the antennas, can be exactly compensated with a new adjustment of the antenna control devices of the antennas, and with a new adjustment of the adjustable impedance devices of the antenna tuning apparatus. Thus, it is always possible to retain low reflections and low losses in the feeders, and to simultaneously compensate the user interaction.

If the adjustable impedance devices (302) each having a first terminal coupled to one of the antenna ports and a second terminal coupled to one of the antenna ports which is different from the antenna port to which the first terminal is coupled were not present in FIG. 4, if the adjustable impedance devices (305) each having a first terminal coupled to one of the radio ports and a second terminal coupled to one of the radio ports which is different from the radio port to which the first terminal is coupled were not present in FIG. 4, and if mutual induction did not exist between the windings (303), then the antenna tuning apparatus (3) comprising n=4 antenna ports and m=4 radio ports would in fact be made up of n=4 antenna tuning apparatuses each having a single antenna port and a single radio port, these antenna tuning apparatuses each having a single antenna port and a single radio port being independent and uncoupled. In this case, the method of the invention may become a method for radio communication with several antennas in a given frequency band, using an apparatus for radio communication that includes n antennas, where n is an integer greater than or equal to 2, the method comprising the steps of:

controlling one or more characteristics of at least one of the antennas, using at least one antenna control device, said at least one antenna control device being a part of said at least one of the antennas, said at least one antenna control device having at least one parameter having an influence on said one or more characteristics, said at least one parameter being adjustable by electrical means;

coupling said n antennas, directly or indirectly, to n antenna tuning apparatuses, each of said antenna tuning apparatuses comprising one antenna port, one radio port, and two or more adjustable impedance devices such that, at a frequency in said given frequency band, each of the adjustable impedance devices of said each of said antenna tuning apparatuses has a reactance, the reactance of any one of the adjustable impedance devices being adjustable by electrical means;

generating a "tuning instruction", the tuning instruction having an effect on each of said parameters, the tuning instruction having an effect on the reactance of each of the adjustable impedance devices of the antenna tuning apparatuses.

In this method, each of the antennas may be coupled, directly or indirectly, to one and only one of the antenna ports of the n antenna tuning apparatuses.

An apparatus implementing this method is an apparatus for radio communication using several antennas in a given frequency band, the apparatus for radio communication comprising:

n antennas, where n is an integer greater than or equal to 2, at least one tunable passive antenna being among said n antennas, said at least one tunable passive antenna comprising at least one antenna control device, one or more characteristics of said at least one tunable passive antenna being controlled using said at least one antenna control device, said at least one antenna control device having at least one parameter having an influence on said one or more characteristics, said at least one parameter being adjustable by electrical means;

n antenna tuning apparatuses, each of said antenna tuning apparatuses comprising one antenna port, one radio port, and two or more adjustable impedance devices such that, at a frequency in said given frequency band, each of the adjustable impedance devices of said each of said antenna tuning apparatuses has a reactance, the reactance of any one of the adjustable impedance devices being adjustable by electrical means;

a processing unit, the processing unit delivering a "tuning instruction";

a tuning control unit, the tuning control unit receiving the tuning instruction, the tuning control unit delivering a plurality of "tuning control signals", the tuning control signals being determined as a function of the tuning instruction, the reactance of each of the adjustable impedance devices of the antenna tuning apparatuses being mainly determined by one or more of the tuning control signals, each of said parameters being mainly determined by one or more of the tuning control signals.

Eighth Embodiment.

The eighth embodiment of a device of the invention, given by way of non-limiting example, is an apparatus for radio communication comprising a radio receiver implementing a method for radio reception with several antennas in a given frequency band, the apparatus for radio communication including n antennas, where n is an integer greater than or equal to 2, the method comprising the steps of:

controlling one or more characteristics of at least one of the antennas, using at least one antenna control device, said at least one antenna control device being a part of said at least one of the antennas, said at least one antenna control device having at least one parameter having an influence on said one or more characteristics, said at least one parameter being adjustable by electrical means;

coupling said n antennas, directly or indirectly, to an antenna tuning apparatus comprising n antenna ports, m radio ports and p adjustable impedance devices, where m is an integer greater than or equal to 2 and where p is an integer greater than or equal to 2m, the p adjustable impedance devices being referred to as "the adjustable impedance devices of the antenna tuning apparatus" and being such that, at a frequency in said given frequency band, each of the adjustable impedance devices of the antenna tuning apparatus has a reactance, the reactance of any one of the adjustable impedance devices of the antenna tuning apparatus being adjustable by electrical means;

processing a plurality of digital signals to estimate one or more quantities representative of a channel matrix;

delivering a "tuning instruction", the tuning instruction being a function of said one or more quantities representative of a channel matrix, the tuning instruction having an effect on each of said parameters, the tuning instruction having an effect on the reactance of each of the adjustable impedance devices of the antenna tuning apparatus.

For instance, as in said French patent application number 12/02564 and said international application number PCT/IB2013/058574, the method may be such that, each of the radio ports delivering a signal, each of the digital signals is mainly determined by one and only one of the signals delivered by the radio ports, and such that the channel matrix is a channel matrix between a plurality of signals sent by a transmitter and the m signals delivered by the radio ports. For instance, one or more quantities representative of a channel capacity maybe computed as a function of said quantities representative of a channel matrix, and the tuning instruction may be delivered as a function of said one or more quantities representative of a channel capacity. The method may also be such that an adaptive process is implemented during one or more training sequences. A training sequence may comprise the emission of a plurality of quasi-orthogonal or orthogonal signals. The tuning instruction selected during the latest completed training sequence is used for radio reception.

In this eighth embodiment, a method used to obtain a tuning instruction comprises the following steps:
  delivering a "first part of the tuning instruction", the first part of the tuning instruction being determined from a set of pre-defined tuning instructions stored in a lookup table (also spelled "look-up table"), based on the frequencies used for radio communication with the antennas, the first part of the tuning instruction having an effect on each of said parameters;
  processing a plurality of digital signals to estimate one or more quantities representative of a channel matrix existing while the first part of the tuning instruction is being applied;
  delivering a "second part of the tuning instruction", the second part of the tuning instruction being a function of said one or more quantities representative of a channel matrix existing while the first part of the tuning instruction is being applied, the second part of the tuning instruction having an effect on the reactance of each of the adjustable impedance devices of the antenna tuning apparatus.

In this method, the tuning instruction is made up of the first part of the tuning instruction and the second part of the tuning instruction. The first part of the tuning instruction is such that the reflections have a high probability of being reduced in each of the feeders. The second part of the tuning instruction is selected among a set of possible second parts of the tuning instruction, for instance as the one which produces the largest channel capacity.

Ninth Embodiment.

The ninth embodiment of a device of the invention, given by way of non-limiting example, is an apparatus for radio communication comprising a radio transmitter implementing a method for radio emission with several antennas in a given frequency band, the apparatus for radio communication including n antennas, where n is an integer greater than or equal to 2, the method comprising the steps of:
  controlling one or more characteristics of at least one of the antennas, using at least one antenna control device, said at least one antenna control device being a part of said at least one of the antennas, said at least one antenna control device having at least one parameter having an influence on said one or more characteristics, said at least one parameter being adjustable by electrical means;
  coupling said n antennas, directly or indirectly, to an antenna tuning apparatus comprising n antenna ports, m radio ports and p adjustable impedance devices, where m is an integer greater than or equal to 2 and where p is an integer greater than or equal to 2m, the p adjustable impedance devices being referred to as "the adjustable impedance devices of the antenna tuning apparatus" and being such that, at a frequency in said given frequency band, each of the adjustable impedance devices of the antenna tuning apparatus has a reactance, the reactance of any one of the adjustable impedance devices of the antenna tuning apparatus being adjustable by electrical means;
  estimating q real quantities depending on an impedance matrix presented by the radio ports, where q is an integer greater than or equal to m, using m or more different excitations applied successively to the radio ports;
  delivering a "tuning instruction", the tuning instruction being a function of said q real quantities depending on an impedance matrix presented by the radio ports, the tuning instruction having an effect on each of said parameters, the tuning instruction having an effect on the reactance of each of the adjustable impedance devices of the antenna tuning apparatus.

The specialist understands that this ninth embodiment uses some aspects of the technique disclosed in said French patent application number 13/00878 and said international application number PCT/IB2014/058933.

In this ninth embodiment, for each of said n antennas, the signal port of the antenna is indirectly coupled to one and only one of the antenna ports of the antenna tuning apparatus, through a feeder and through a directional coupler used to determine one or more quantities depending on the reflected waves and/or on the incident waves in the feeder. A method used to obtain a tuning instruction comprises the following steps:
  estimating, for each of the feeders, one or more quantities depending on the reflected waves and/or the incident waves in said each of the feeders;
  delivering a "first part of the tuning instruction", the first part of the tuning instruction being a function of said quantities depending on the reflected waves and/or on the incident waves in each of the feeders, the first part of the tuning instruction having an effect on each of said parameters;
  estimating q real quantities depending on an impedance matrix presented by the radio ports while the first part of the tuning instruction is being applied, where q is an integer greater than or equal to m, using m or more different excitations applied successively to the radio ports while the first part of the tuning instruction is being applied;
  delivering a "second part of the tuning instruction", the second part of the tuning instruction being a function of said q real quantities depending on an impedance matrix presented by the radio ports while the first part of the tuning instruction is being applied, the second part of the tuning instruction having an effect on the reactance of each of the adjustable impedance devices of the antenna tuning apparatus.

In this method, the tuning instruction is made up of the first part of the tuning instruction and the second part of the tuning instruction. The first part of the tuning instruction is such that the reflections are reduced in each of the feeders. The second part of the tuning instruction is such that the impedance matrix presented by the radio ports is close to a specified matrix. Consequently, it is possible to reduce the losses in the feeders and to simultaneously obtain that the impedance matrix seen by a radio device approximates an arbitrary wanted matrix.

Tenth Embodiment.

Figure 10:
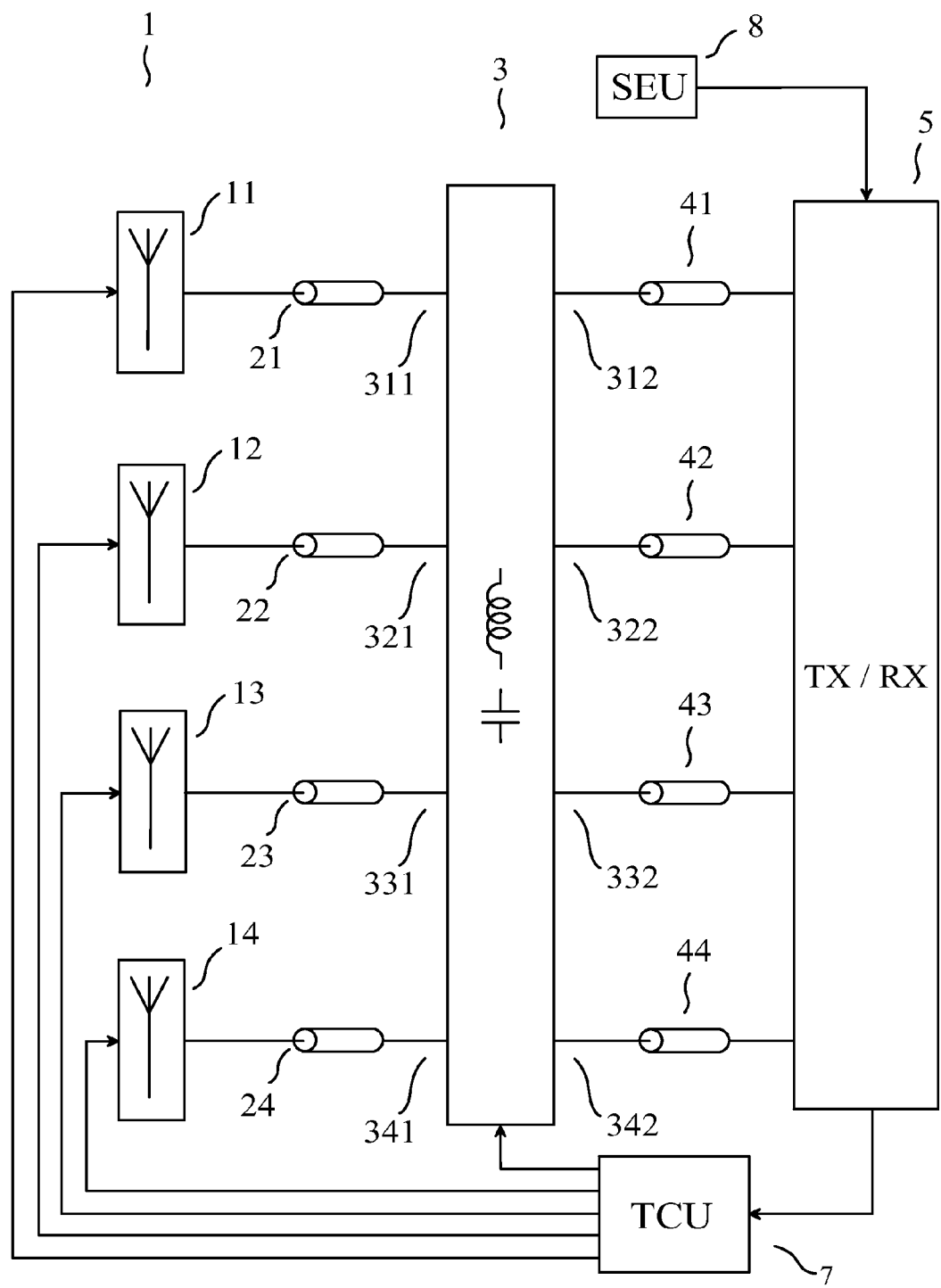
FIG. 10 shows a block diagram of a transceiver for radio communication of the invention, which simultaneously uses 4 tunable passive antennas.

As a tenth embodiment of an apparatus of the invention, given by way of non-limiting example, we have represented in FIG. 10 the block diagram of a portable apparatus for radio communication, the apparatus for radio communication being a transceiver comprising:

n=4 antennas (11) (12) (13) (14), the n antennas operating simultaneously in a given frequency band, the n antennas forming an antenna array (1), each of the antennas being a tunable passive antenna comprising at least one antenna control device, said at least one antenna control device having at least one parameter having an effect on one or more characteristics of said tunable passive antenna, said at least one parameter being adjustable by electrical means;

a radio device (5) which consists of all parts of the apparatus for radio communication which are not shown elsewhere in FIG. 10;

a sensor unit (8) estimating a plurality of localization variables;

an antenna tuning apparatus (3), the antenna tuning apparatus being a multiple-antenna-port and multiple-radio-port antenna tuning apparatus, the antenna tuning apparatus comprising n=4 antenna ports (311) (321) (331) (341), each of the antenna ports being coupled to one of the antennas through a feeder (21) (22) (23) (24), the antenna tuning apparatus comprising m=4 radio ports (312) (322) (332) (342), each of the radio ports being coupled to the radio device (5) through an interconnection (41) (42) (43) (44), the antenna tuning apparatus comprising p adjustable impedance devices, where p is an integer greater than or equal to 2m, the p adjustable impedance devices being referred to as "the adjustable impedance devices of the antenna tuning apparatus" and being such that, at a frequency in said given frequency band, each of the adjustable impedance devices of the antenna tuning apparatus has a reactance, the reactance of any one of the adjustable impedance devices of the antenna tuning apparatus being adjustable by electrical means;

a tuning control unit (7), the tuning control unit receiving a "tuning instruction" generated automatically within the apparatus for radio communication, the tuning control unit delivering a plurality of "tuning control signals" to the antenna tuning apparatus and to each of the tunable passive antennas, the tuning control signals being determined as a function of the tuning instruction, the reactance of each of the adjustable impedance devices of the antenna tuning apparatus being mainly determined by one or more of the tuning control signals, each of said parameters being mainly determined by one or more of the tuning control signals.

The sensor unit (8) estimates a plurality of localization variables each depending, in a given use configuration, on the distance between a part of a human body and a zone of the apparatus for radio communication. The sensor unit comprises a plurality of sensors. Each of said zones may be a part of the space occupied by the corresponding sensor, this space being inside the space occupied by the apparatus for radio communication, so that in this case each of said zones has a volume much less than the volume of the apparatus for radio communication. For each of the antennas, at least one of the localization variables may depend on the distance between a part of a human body and a small zone near said each of the antennas. If a suitable sensor is used, said zone may be a point, or substantially a point.

For instance, at least one of the localization variables may be an output of a sensor responsive to a pressure exerted by a part of a human body. For instance, at least one of the localization variables may be an output of a proximity sensor.

The sensor unit (8) assesses (or equivalently, estimates) a plurality of localization variables each depending, in a given use configuration, on the distance between a part of a human body and a zone of the apparatus for radio communication. However, it is possible that one or more other localization variables each depending, in a given use configuration, on the distance between a part of a human body and a zone of the apparatus for radio communication, are not estimated by the sensor unit. For instance, at least one of the localization variables may be determined by a change of state of an output of a touchscreen. Thus, the sensor unit (8) may be regarded as a part of a localization unit which estimates (or evaluates) a plurality of localization variables each depending on the distance between a part of a human body and a zone of the apparatus for radio communication. This part of the localization unit may be the whole localization unit.

It is possible that a first of said localization variables depends on the distance between a part of a human body and a first zone of the apparatus for radio communication, a second of said localization variables depends on the distance between a part of a human body and a second zone of the apparatus for radio communication, the first zone of the apparatus for radio communication and the second zone of the apparatus for radio communication being distinct from one another. Distinct zones may have an empty intersection or a non-empty intersection.

The tuning instruction is generated automatically within the radio device (5). More precisely, the radio device (5) comprises a processing unit (not shown in FIG. 10) which delivers the tuning instruction, each of the localization variables having an influence on the tuning instruction. For instance, the tuning instruction may be determined from a set of pre-defined tuning instructions stored in a lookup table realized in the processing unit, based on the localization variables and on the frequencies used for radio communication with the antennas (11) (12) (13) (14).

The specialist understands that this tenth embodiment uses some aspects of the technique disclosed in the French patent application number 14/00606 entitled "Communication radio utilisant des antennes multiples et des variables de localisation", corresponding to the international application number PCT/IB2015/051548 entitled "Radio communication using multiple antennas and localization variables".

Eleventh Embodiment.

The eleventh embodiment of a device of the invention, given by way of non-limiting example, also corresponds to the portable apparatus for radio communication represented in FIG. 10, and all explanations provided for the tenth embodiment are applicable to this eleventh embodiment.

In this eleventh embodiment, the tuning instruction is determined as a function of:

the localization variables, each of the localization variables having an influence on the tuning instruction;

the frequencies used for radio communication with the antennas;

one or more additional variables, each of the additional variables lying in a set of additional variables, the elements of the set of additional variables comprising: communication type variables which indicate whether a radio communication session is a voice communication session, a data communication session or another type of communication session; a speakerphone mode activation indicator; a speaker activation indicator; variables obtained using one or more accelerometers; user identity variables which depend on the identity of the current user; reception quality variables which for instance include the quantities representative of a channel matrix of the eighth embodiment; and radio port variables which for instance include the real quantities depending on an impedance matrix presented by the radio ports of the ninth embodiment.

The elements of said set of additional variables may further comprise one or more variables which are different from the localization variables and which characterize the grip with which a user is holding the apparatus for radio communication.

In this eleventh embodiment, the tuning instruction may for instance be determined using a lookup table realized in the processing unit.

Based on the teachings of the patent of the U.S. Pat. No. 8,204,446 entitled "Adaptive Antenna Tuning Systems and Methods", the specialist understands that the antenna tuning obtained in this eleventh embodiment may be more accurate than an antenna tuning wherein the tuning instruction is only a function of the localization variables. The specialist also understands that the antenna tuning obtained in this eleventh embodiment may be simultaneously accurate and such that the tuning instruction is generated quickly and without requiring a large computational resource.

INDICATIONS ON INDUSTRIAL APPLICATIONS

The invention is suitable for radio communication using multiple antennas. Thus, the invention is suitable for MIMO radio communication. The apparatus for radio communication may be an apparatus for MIMO radio communication, that is to say an apparatus for MIMO radio reception and/or an apparatus for MIMO radio emission.

The invention provides the best possible characteristics using very close antennas, hence presenting a strong interaction between the antennas. The invention is therefore particularly suitable for mobile apparatuses for radio communication, for instance mobile phones, tablet computers and portable computers.

The invention claimed is:

1. A method for radio communication with several antennas in a given frequency band, the method using an apparatus for radio communication that includes n antennas, where n is an integer greater than or equal to 3, the method comprising:
controlling one or more characteristics of at least one of the antennas, using at least one antenna control device, the at least one antenna control device being a part of the at least one of the antennas, the at least one antenna control device having at least one parameter having an influence on the one or more characteristics, and the at least one parameter being adjustable by electrical means;
coupling the n antennas, directly or indirectly, to an antenna tuning apparatus comprising n antenna ports, m radio ports and p adjustable impedance devices, where m is an integer greater than or equal to 2 and where p is an integer greater than or equal to 2 m, the p adjustable impedance devices being referred to as the adjustable impedance devices of the antenna tuning apparatus and being such that, at a frequency in the given frequency band, each of the adjustable impedance devices of the antenna tuning apparatus has a reactance, the reactance of any one of the adjustable impedance devices of the antenna tuning apparatus being adjustable by electrical means, the antenna tuning apparatus being such that, at the frequency in the given frequency band, there exists a diagonal impedance matrix referred to as the given diagonal impedance matrix, the given diagonal impedance matrix being such that, if an impedance matrix seen by the antenna ports is equal to the given diagonal impedance matrix, then the reactance of any one of the adjustable impedance devices of the antenna tuning apparatus has an influence on an impedance matrix presented by the radio ports, and the reactance of at least one of the adjustable impedance devices of the antenna tuning apparatus has an influence on at least one non-diagonal entry of the impedance matrix presented by the radio ports; and
generating a tuning instruction, the tuning instruction having an effect on each of the parameters, the tuning instruction having an effect on the reactance of each of the adjustable impedance devices of the antenna tuning apparatus.

2. The method for radio communication of claim 1, wherein at least one of the antenna control devices is an electrically controlled switch or change-over switch.

3. The method for radio communication of claim 1, wherein at least one of the antenna control devices is an adjustable impedance device.

4. The method for radio communication of claim 1, wherein at least one of the antenna control devices is an actuator arranged to produce a mechanical deformation of one of the antennas.

5. The method for radio communication of claim 1, wherein the apparatus for radio communication comprises a radio receiver, the tuning instruction being a function of one or more quantities representative of a channel matrix.

6. The method for radio communication of claim 1, wherein the apparatus for radio communication comprises a radio transmitter, the tuning instruction being a function of q real quantities depending on an impedance matrix presented by the radio ports, where q is an integer greater than or equal to m.

7. The method for radio communication of claim 6, wherein, for each of the n antennas, a port of the antenna is indirectly coupled to one and only one of the antenna ports of the antenna tuning apparatus through a feeder, and
wherein the tuning instruction is made up of a first part of the tuning instruction and a second part of the tuning instruction, the first part of the tuning instruction being a function of quantities depending on reflected waves in the feeders, the first part of the tuning instruction having an effect on the parameters.

8. The method for radio communication of claim 1, wherein the tuning instruction is made up of a first part of the tuning instruction and a second part of the tuning instruction, the first part of the tuning instruction being determined from a set of pre-defined tuning instructions stored in a lookup table, based on the frequencies used for radio communication with the antennas, the first part of the tuning instruction having an effect on the parameters.

9. The method for radio communication of claim 8, wherein the apparatus for radio communication comprises a radio receiver, the second part of the tuning instruction being a function of one or more quantities representative of a channel matrix existing while the first part of the tuning instruction is being applied, the second part of the tuning instruction having an effect on the reactance of each of the adjustable impedance devices of the antenna tuning apparatus.

10. The method for radio communication of claim 1, wherein one or more localization variables are estimated, each of the localization variables depending on the distance between a part of a human body and a zone of the apparatus for radio communication, each of the localization variables having an influence on the tuning instruction.

11. An apparatus for radio communication in a given frequency band, the apparatus for radio communication comprising:
    n antennas, where n is an integer greater than or equal to 3, including at least one tunable passive antenna being among the n antennas, the at least one tunable passive antenna comprising at least one antenna control device, the at least one antenna control device having at least one parameter having an influence on one or more characteristics of the at least one tunable passive antenna, the at least one parameter being adjustable by electrical means;
    an antenna tuning apparatus comprising n antenna ports, m radio ports and p adjustable impedance devices, where m is an integer greater than or equal to 2 and where p is an integer greater than or equal to 2 m, the p adjustable impedance devices being such that, at a frequency in the given frequency band, each of the adjustable impedance devices has a reactance, the antenna tuning apparatus being such that, at the frequency in the given frequency band, there exists a diagonal impedance matrix referred to as the given diagonal impedance matrix, the given diagonal impedance matrix being such that, if an impedance matrix seen by the antenna ports is equal to the given diagonal impedance matrix, then the reactance of any one of the adjustable impedance devices of the antenna tuning apparatus has an influence on an impedance matrix presented by the radio ports, and the reactance of at least one of the adjustable impedance devices of the antenna tuning apparatus has an influence on at least one non-diagonal entry of the impedance matrix presented by the radio ports; and
    at least one processor configured to deliver a tuning instruction to a tuning controller, the tuning controller is configured to:
        receive the tuning instruction, and
        deliver to the antenna tuning apparatus and the at least one tunable passive antenna a plurality of tuning control signals determined based on the tuning instruction, the reactance of each of the adjustable impedance devices of the antenna tuning apparatus being determined by one or more of the tuning control signals, each of the parameters being determined by one or more of the tuning control signals.

12. The apparatus for radio communication of claim 11, wherein at least one of the antenna control devices is an electrically controlled switch or change-over switch.

13. The apparatus for radio communication of claim 11, wherein at least one of the antenna control devices is an adjustable impedance device.

14. The apparatus for radio communication of claim 11, wherein at least one of the antenna control devices is an actuator arranged to produce a mechanical deformation of one of the antennas.

15. The apparatus for radio communication of claim 11, wherein the apparatus for radio communication comprises a radio receiver, the tuning instruction being a function of one or more quantities representative of a channel matrix.

16. The apparatus for radio communication of claim 11, wherein the apparatus for radio communication comprises a radio transmitter, the tuning instruction being a function of q real quantities depending on an impedance matrix presented by the radio ports, where q is an integer greater than or equal to m.

17. The apparatus for radio communication of claim 16, wherein, for each of the n antennas, a port of the antenna is indirectly coupled to one and only one of the antenna ports of the antenna tuning apparatus through a feeder, and
    wherein the tuning instruction is made up of a first part of the tuning instruction and a second part of the tuning instruction, the first part of the tuning instruction being a function of quantities depending on reflected waves in the feeders, the first part of the tuning instruction having an effect on the parameters.

18. The apparatus for radio communication of claim 11, wherein the tuning instruction is made up of a first part of the tuning instruction and a second part of the tuning instruction, the first part of the tuning instruction being determined from a set of pre-defined tuning instructions stored in a lookup table, based on the frequencies used for radio communication with the antennas, the first part of the tuning instruction having an effect on the parameters.

19. The apparatus for radio communication of claim 18, wherein the apparatus for radio communication comprises a radio receiver, the second part of the tuning instruction being a function of one or more quantities representative of a channel matrix existing while the first part of the tuning instruction is being applied, the second part of the tuning instruction having an effect on the reactance of each of the adjustable impedance devices of the antenna tuning apparatus.

20. The apparatus for radio communication of claim 11, wherein one or more localization variables are estimated, each of the localization variables depending on the distance between a part of a human body and a zone of the apparatus for radio communication, each of the localization variables having an influence on the tuning instruction.

21. A method for radio communication with several antennas in a given frequency band, the method using an apparatus for radio communication that includes n antennas, where n is an integer greater than or equal to 2, the method comprising:
    controlling one or more characteristics of at least one of the antennas, using at least one antenna control device, the at least one antenna control device being a part of the at least one of the antennas, the at least one antenna control device having at least one parameter having an influence on the one or more characteristics, the at least one parameter being adjustable by electrical means;
    coupling the n antennas, directly or indirectly, to an antenna tuning apparatus comprising n antenna ports, m radio ports and p adjustable impedance devices, where m is an integer greater than or equal to 2 and where p is an integer greater than or equal to 2 m, the p adjustable impedance devices being referred to as the adjustable impedance devices of the antenna tuning apparatus and being such that, at a frequency in the given frequency band, each of the adjustable impedance devices of the antenna tuning apparatus has a reactance, the reactance of any one of the adjustable impedance devices of the antenna tuning apparatus being adjustable by electrical means;

estimating a plurality of localization variables, each of the localization variables depending on the distance between a part of a human body and a zone of the apparatus for radio communication; and generating a tuning instruction, each of the localization variables having an influence on the tuning instruction, the tuning instruction having an effect on each of the parameters, the tuning instruction having an effect on the reactance of each of the adjustable impedance devices of the antenna tuning apparatus.

22. The method for radio communication of claim 21, wherein at least one of the antenna control devices is an electrically controlled switch or change-over switch.

23. The method for radio communication of claim 21, wherein at least one of the antenna control devices is an adjustable impedance device.

24. The method for radio communication of claim 21, wherein at least one of the antenna control devices is an actuator arranged to produce a mechanical deformation of one of the antennas.

25. The method for radio communication of claim 21, wherein the apparatus for radio communication comprises a radio receiver, the tuning instruction being a function of one or more quantities representative of a channel matrix.

26. The method for radio communication of claim 21, wherein the apparatus for radio communication comprises a radio transmitter, the tuning instruction being a function of q real quantities depending on an impedance matrix presented by the radio ports, where q is an integer greater than or equal to m.

27. The method for radio communication of claim 21, wherein the tuning instruction is made up of a first part of the tuning instruction and a second part of the tuning instruction, the first part of the tuning instruction being a function of the localization variables and of the frequencies used for radio communication with the antennas, the first part of the tuning instruction having an effect on the parameters.

28. The method for radio communication of claim 27, wherein the first part of the tuning instruction is determined from a set of pre-defined tuning instructions stored in a lookup table, based on the localization variables and on the frequencies used for radio communication with the antennas.

29. The method for radio communication of claim 21, wherein the antenna tuning apparatus is such that, at the frequency in the given frequency band, there exists a diagonal impedance matrix referred to as the given diagonal impedance matrix, the given diagonal impedance matrix being such that, if an impedance matrix seen by the antenna ports is equal to the given diagonal impedance matrix, then the reactance of any one of the adjustable impedance devices of the antenna tuning apparatus has an influence on an impedance matrix presented by the radio ports, and the reactance of at least one of the adjustable impedance devices of the antenna tuning apparatus has an influence on at least one non-diagonal entry of the impedance matrix presented by the radio ports.

30. The method for radio communication of claim 21, wherein the antenna tuning apparatus is made up of n antenna tuning apparatuses each comprising one of the antenna ports, one of the radio ports, and two or more of the adjustable impedance devices of the antenna tuning apparatus.

31. An apparatus for radio communication in a given frequency band, the apparatus for radio communication comprising:

n antennas, where n is an integer greater than or equal to 2, including at least one tunable passive antenna being among the n antennas, the at least one tunable passive antenna comprising at least one antenna control device, the at least one antenna control device having at least one parameter having an influence on one or more characteristics of the at least one tunable passive antenna, the at least one parameter being adjustable by electrical means;

an antenna tuning apparatus comprising n antenna ports, m radio ports and p adjustable impedance devices, where m is an integer greater than or equal to 2 and where p is an integer greater than or equal to 2 m, the p adjustable impedance devices being such that, at a frequency in the given frequency band, each of the adjustable impedance devices has a reactance; and at least one processor configured to:
  estimate a plurality of variables, each of the variables being referred to as localization variable, each of the localization variables depending on the distance between a part of a human body and a zone of the apparatus for radio communication, and
  deliver a tuning instruction, each of the localization variables having an influence on the tuning instruction, wherein the tuning controller is configured to:
  receive the tuning instruction, and
  deliver to the antenna tuning apparatus and the at least one tunable passive antenna a plurality of tuning control signals determined based on the tuning instruction, the reactance of each of the adjustable impedance devices of the antenna tuning apparatus being determined by one or more of the tuning control signals, each of the parameters being determined by one or more of the tuning control signals.

32. The apparatus for radio communication of claim 31, wherein at least one of the antenna control devices is an electrically controlled switch or change-over switch.

33. The apparatus for radio communication of claim 31, wherein at least one of the antenna control devices is an adjustable impedance device.

34. The apparatus for radio communication of claim 31, wherein at least one of the antenna control devices is an actuator arranged to produce a mechanical deformation of one of the antennas.

35. The apparatus for radio communication of claim 31, wherein the apparatus for radio communication comprises a radio receiver, the tuning instruction being a function of one or more quantities representative of a channel matrix.

36. The apparatus for radio communication of claim 31, wherein the apparatus for radio communication comprises a radio transmitter, the tuning instruction being a function of q real quantities depending on an impedance matrix presented by the radio ports, where q is an integer greater than or equal to m.

37. The apparatus for radio communication of claim 31, wherein the tuning instruction is made up of a first part of the tuning instruction and a second part of the tuning instruction, the first part of the tuning instruction being a function of the localization variables and of the frequencies used for radio communication with the antennas, the first part of the tuning instruction having an effect on the parameters.

38. The apparatus for radio communication of claim 37, wherein the first part of the tuning instruction is determined from a set of pre-defined tuning instructions stored in a lookup table, based on the localization variables and on the frequencies used for radio communication with the antennas.

39. The apparatus for radio communication of claim 31, wherein the antenna tuning apparatus is such that, at the frequency in the given frequency band, there exists a diagonal impedance matrix referred to as the given diagonal impedance matrix, the given diagonal impedance matrix being such that, if an impedance matrix seen by the antenna ports is equal to the given diagonal impedance matrix, then the reactance of any one of the adjustable impedance devices of the antenna tuning apparatus has an influence on an impedance matrix presented by the radio ports, and the reactance of at least one of the adjustable impedance devices of the antenna tuning apparatus has an influence on at least one non-diagonal entry of the impedance matrix presented by the radio ports.

40. The apparatus for radio communication of claim 31, wherein the antenna tuning apparatus is made up of n antenna tuning apparatuses each comprising one of the antenna ports, one of the radio ports, and two or more of the adjustable impedance devices of the antenna tuning apparatus.

* * * * *